(12) United States Patent
Park

(10) Patent No.: US 10,461,127 B2
(45) Date of Patent: Oct. 29, 2019

(54) VARIABLE RESISTANCE MEMORY DEVICE AND METHOD OF MANUFACTURING THE SAME

(71) Applicant: Samsung Electronics Co., Ltd., Suwon-si, Gyeonggi-do (KR)

(72) Inventor: Jong-chul Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/864,388

(22) Filed: Jan. 8, 2018

(65) Prior Publication Data

US 2019/0006422 A1    Jan. 3, 2019

(30) Foreign Application Priority Data

Jul. 3, 2017 (KR) ........................ 10-2017-0084407

(51) Int. Cl.
| | | |
|---|---|---|
| *H01L 27/24* | (2006.01) | |
| *H01L 45/00* | (2006.01) | |
| *G11C 13/00* | (2006.01) | |

(52) U.S. Cl.
CPC ...... *H01L 27/2463* (2013.01); *G11C 13/0004* (2013.01); *G11C 13/004* (2013.01); *G11C 13/0069* (2013.01); *G11C 13/0097* (2013.01); *H01L 27/2427* (2013.01); *H01L 27/2481* (2013.01); *H01L 45/04* (2013.01); *H01L 45/06* (2013.01); *H01L 45/126* (2013.01); *H01L 45/1233* (2013.01); *H01L 45/144* (2013.01); *H01L 45/146* (2013.01); *H01L 45/1608* (2013.01); *H01L 45/1675* (2013.01); *G11C 2013/008* (2013.01); *G11C 2213/71* (2013.01); *G11C 2213/73* (2013.01)

(58) Field of Classification Search
None
See application file for complete search history.

(56) References Cited

U.S. PATENT DOCUMENTS

| | | |
|---|---|---|
| 8,168,479 B2 | 5/2012 | Ha |
| 8,440,535 B2 | 5/2013 | Dennison |
| 8,575,753 B2 | 11/2013 | Choi et al. |
| 8,680,500 B2 | 3/2014 | Oh et al. |
| 8,824,187 B2 | 9/2014 | Park et al. |
| 9,520,556 B2 | 12/2016 | Horii et al. |
| 2009/0057644 A1 | 3/2009 | Shin et al. |
| 2014/0124726 A1* | 5/2014 | Oh ................ H01L 45/144 257/4 |
| 2017/0243923 A1* | 8/2017 | Jeong ............... G11C 13/0004 |

FOREIGN PATENT DOCUMENTS

KR    10-0876767 B1    1/2009

* cited by examiner

*Primary Examiner* — Marcos D. Pizarro
*Assistant Examiner* — Lawrence C Tynes, Jr.
(74) *Attorney, Agent, or Firm* — Harness, Dickey & Pierce, P.L.C.

(57) ABSTRACT

A variable resistance memory device including a first conductive line extending in a first direction on a substrate, a second conductive line on the first conductive line and extending in a second direction crossing the first direction, and a memory cell pillar connected to the first conductive line and the second conductive line at a crossing point therebetween and including a heating electrode layer and a variable resistance layer in contact with the heating electrode layer such that both sidewalls of the heating electrode layer are aligned with both sidewalls of the first conductive line in the first direction.

20 Claims, 30 Drawing Sheets

[FIG. 1]
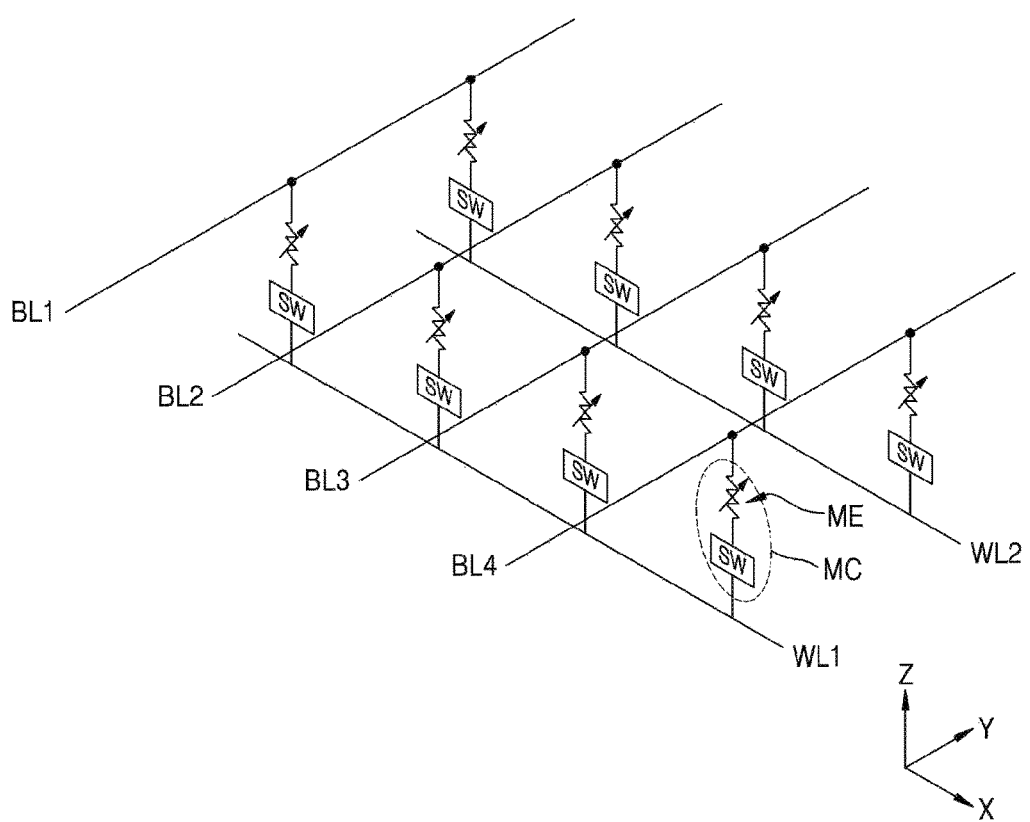

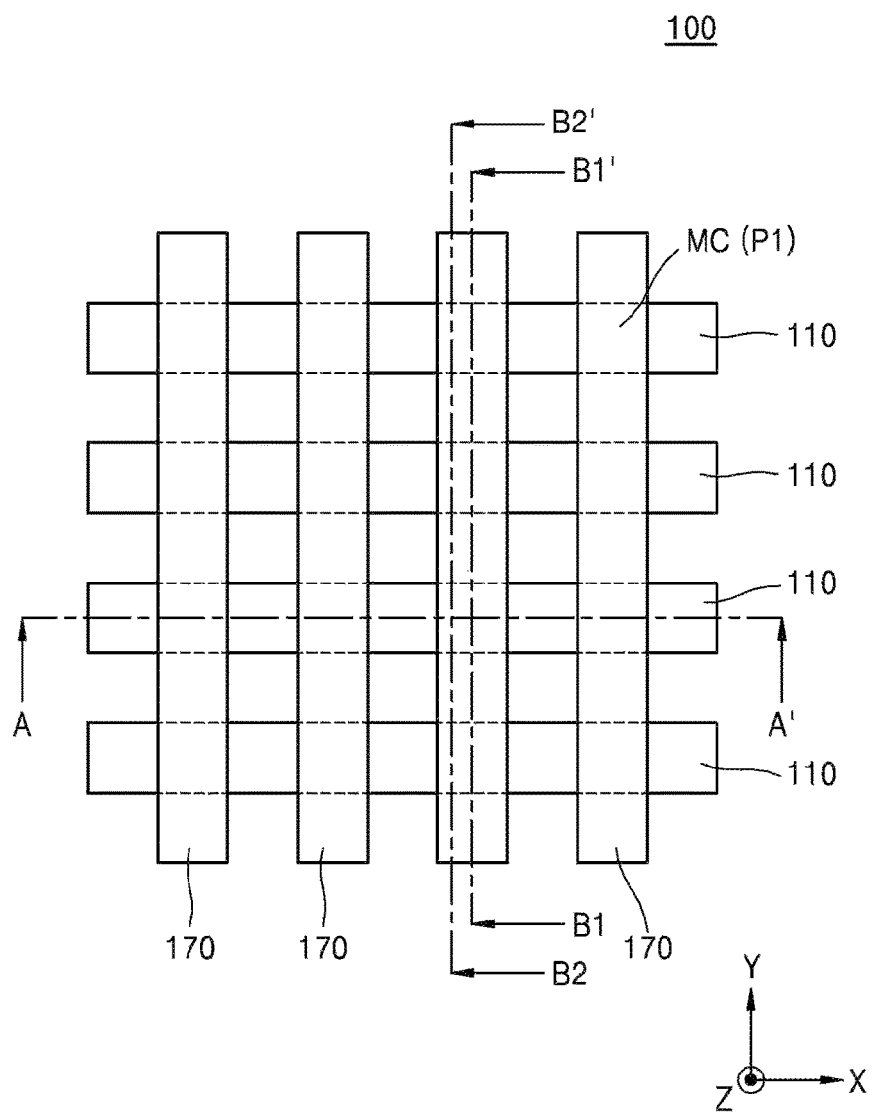
[FIG. 2]

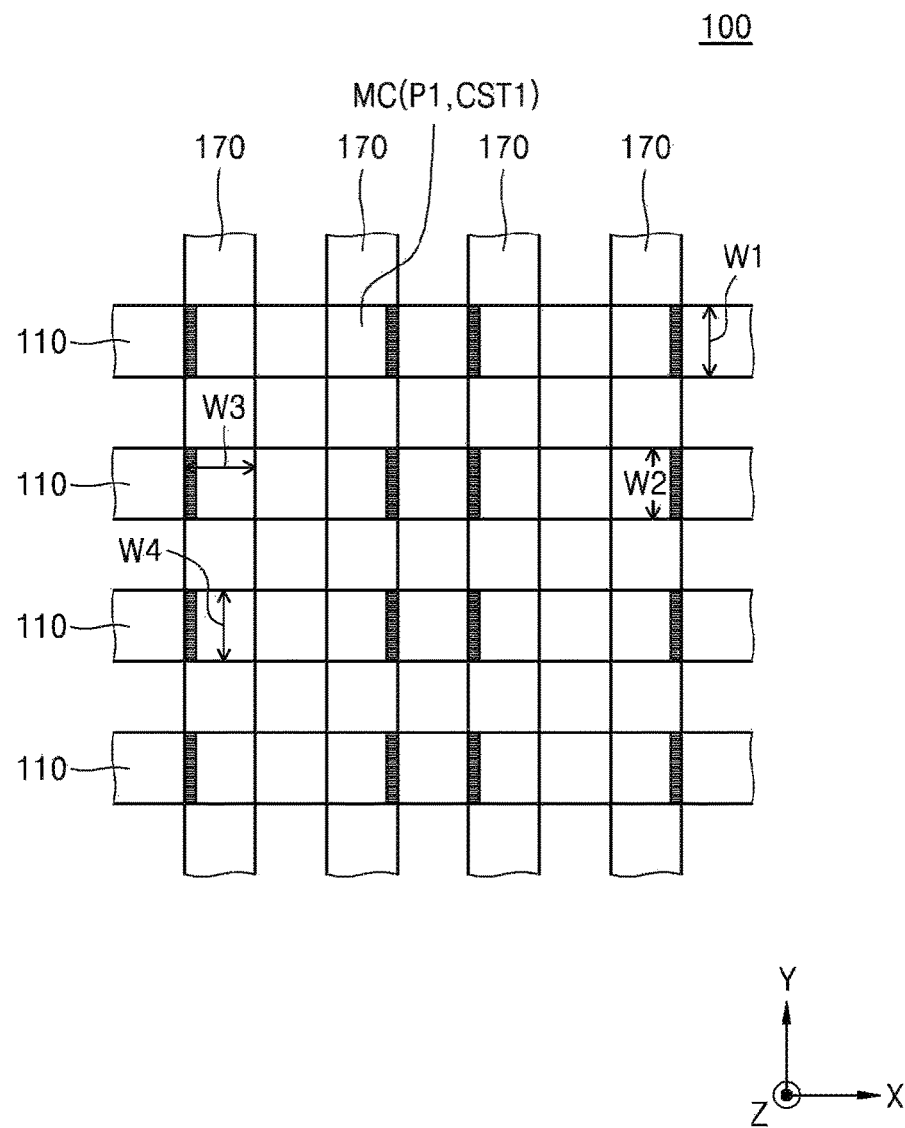

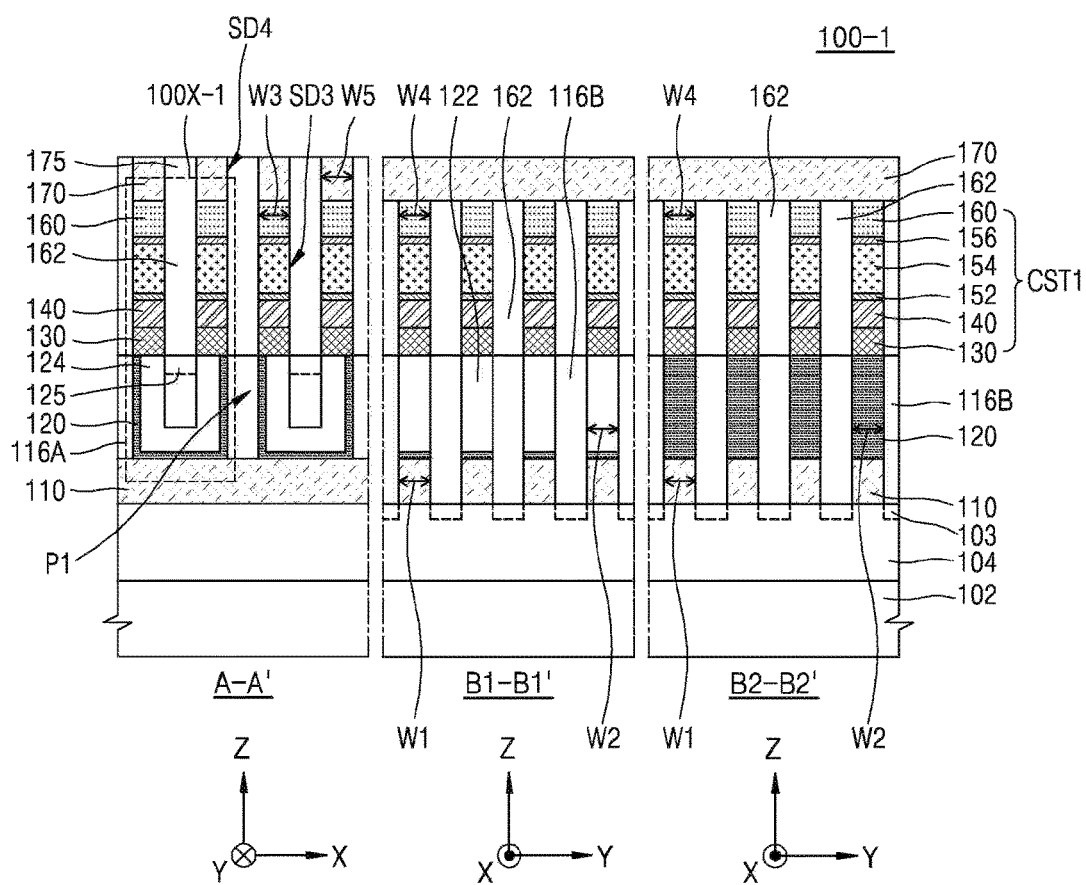
[FIG. 4a]

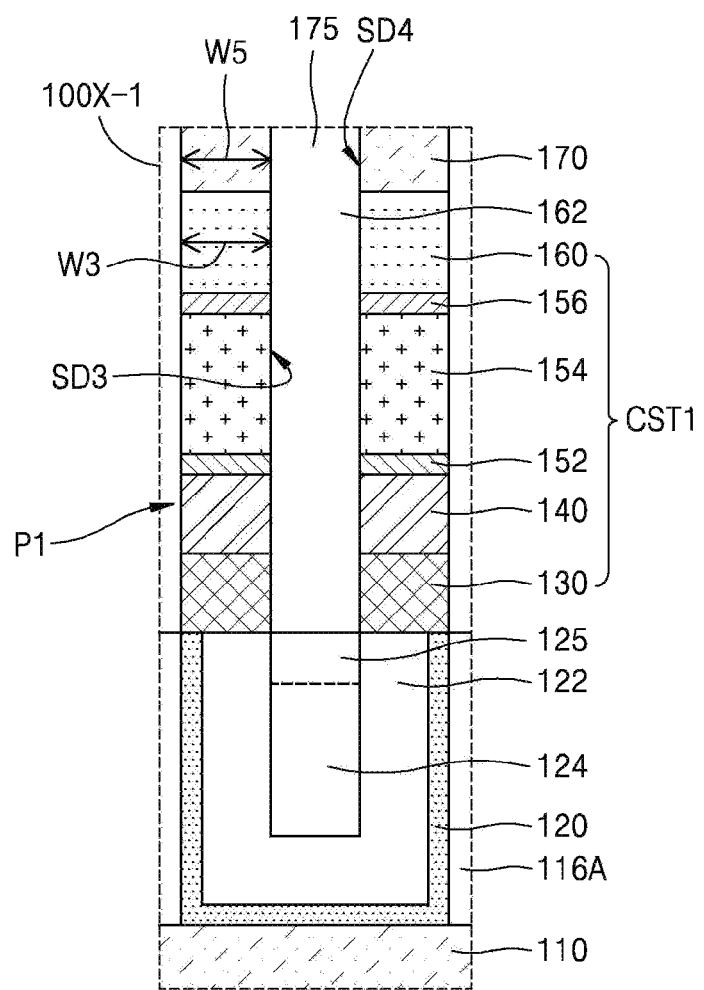
[FIG. 4b]

[FIG. 6]
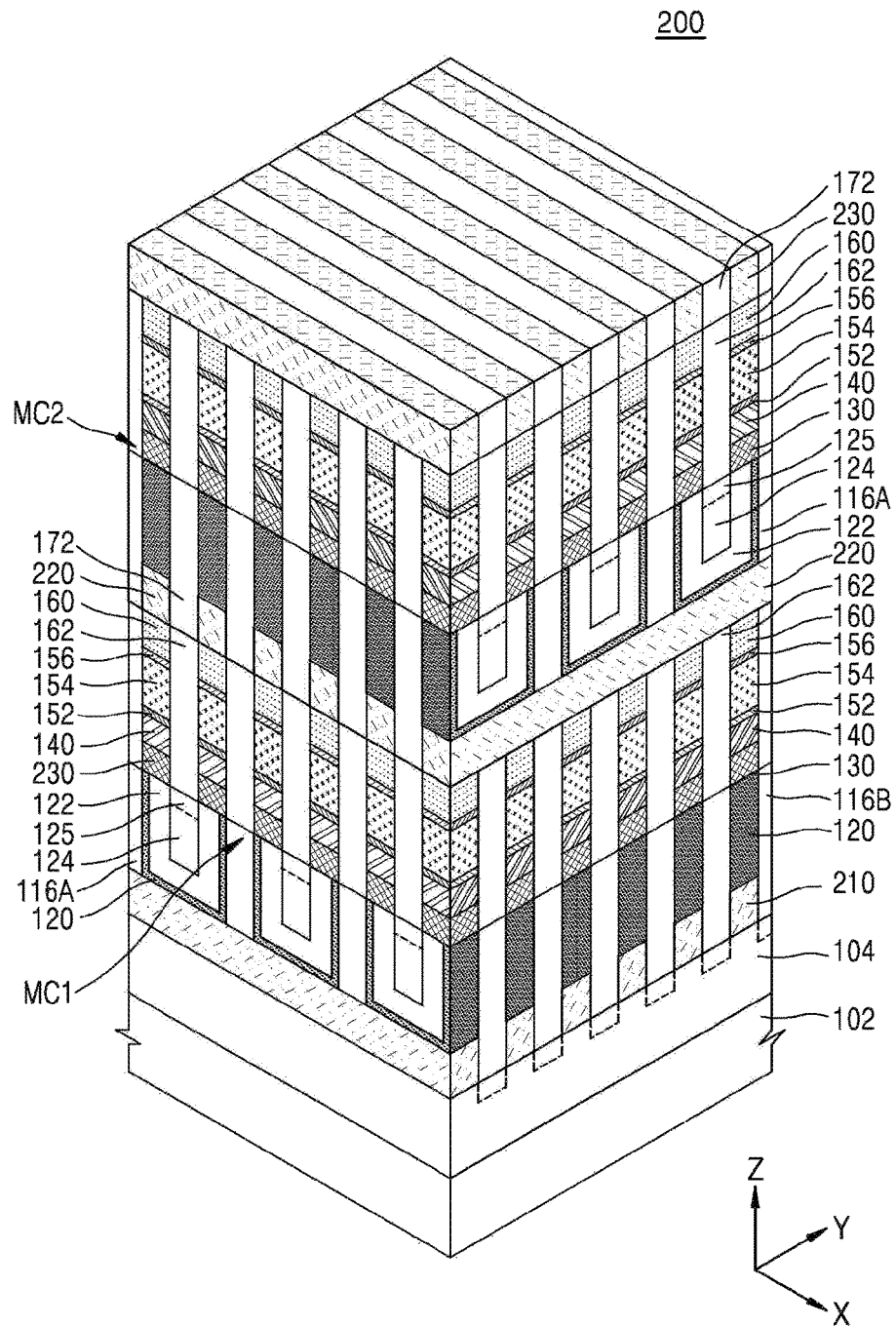

A-A'

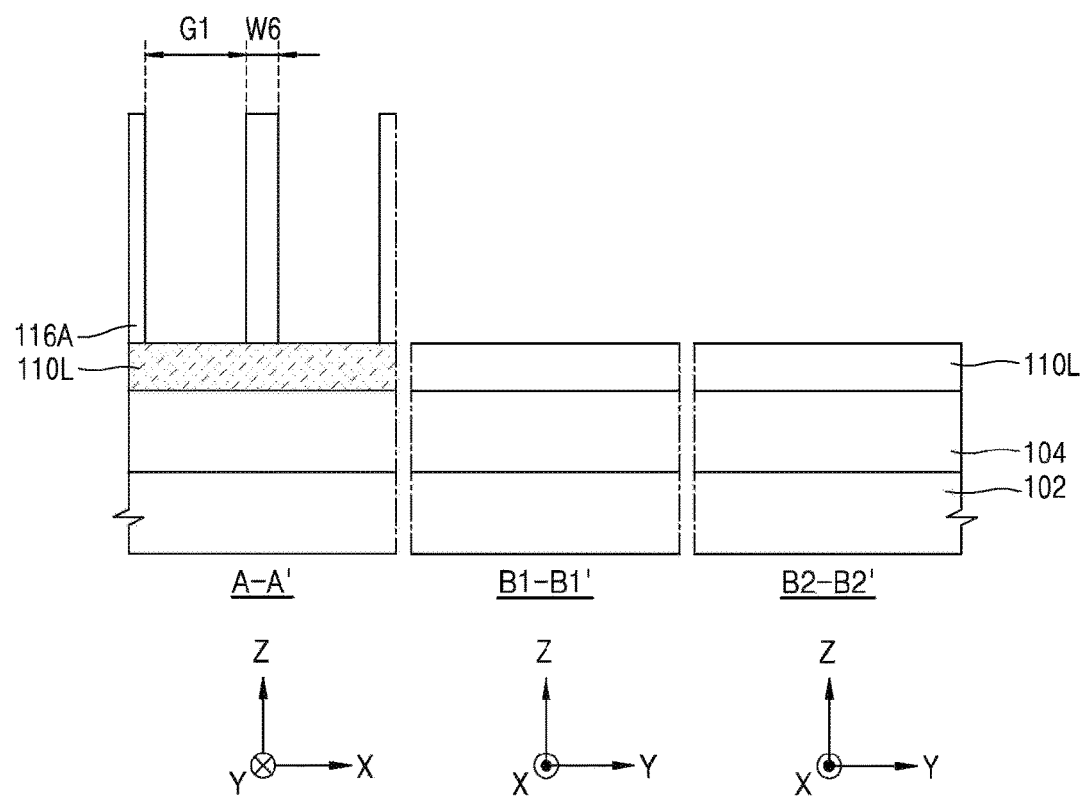

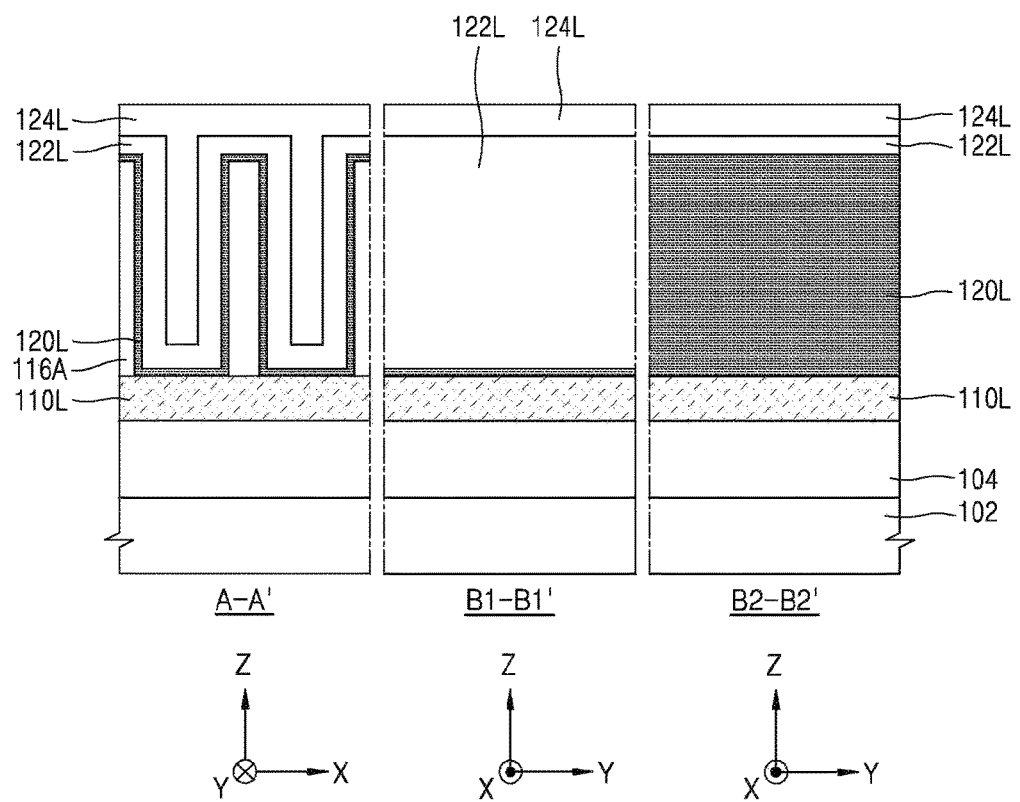

【FIG. 10】
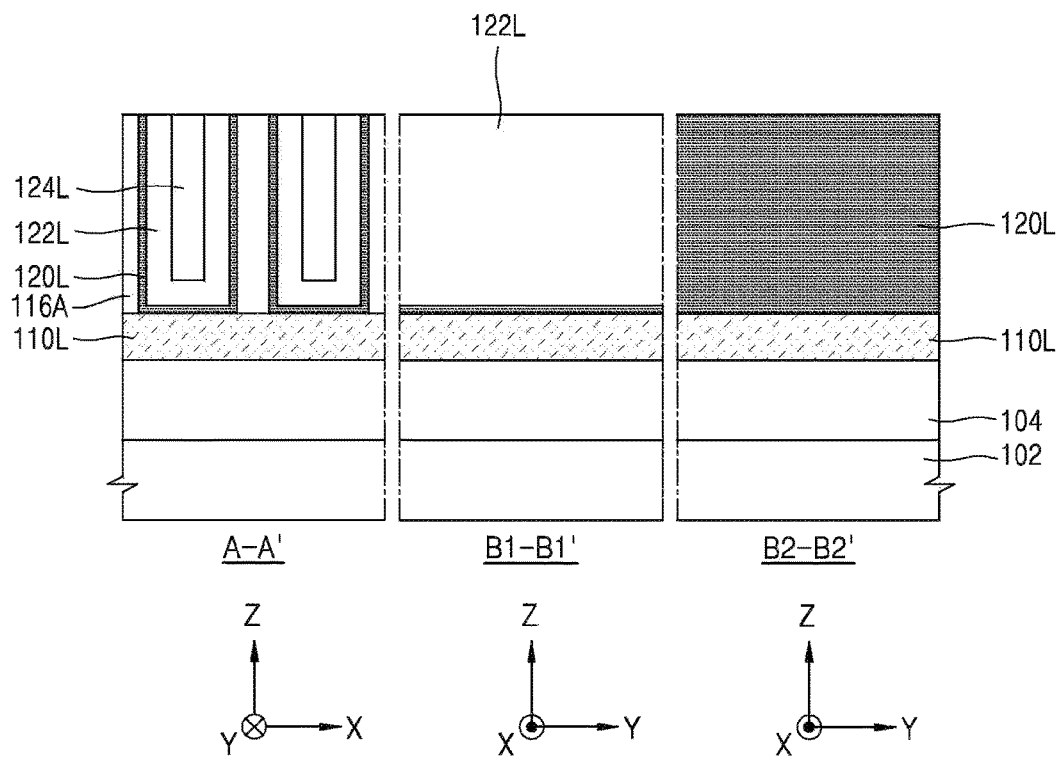

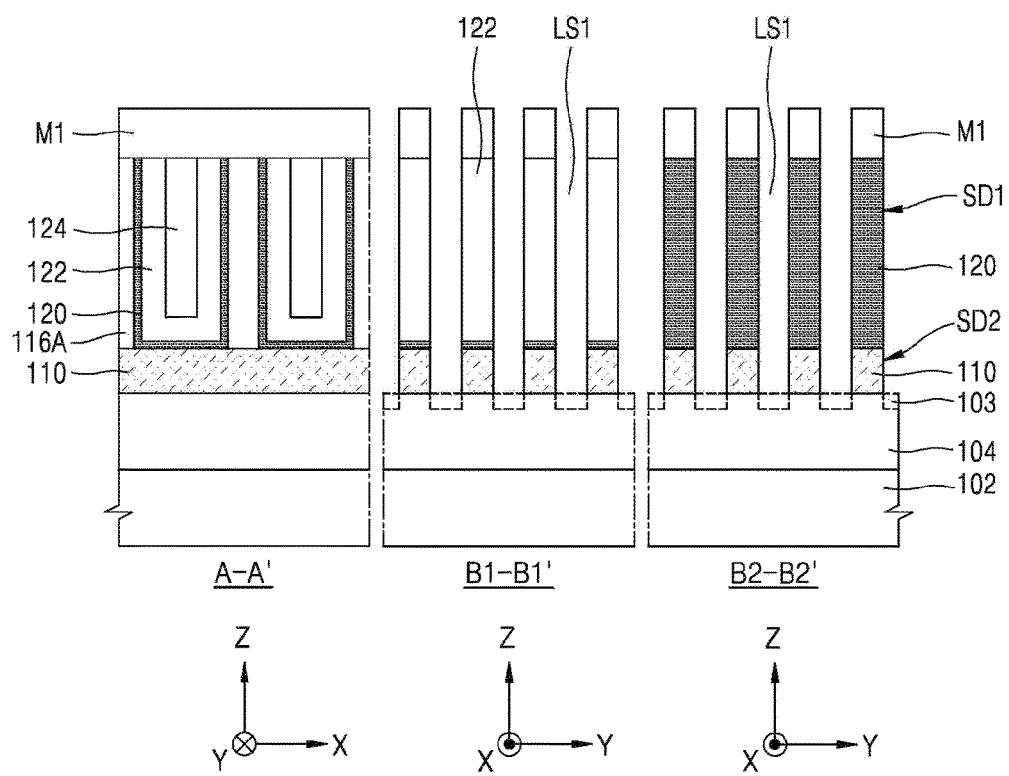

[FIG. 12]
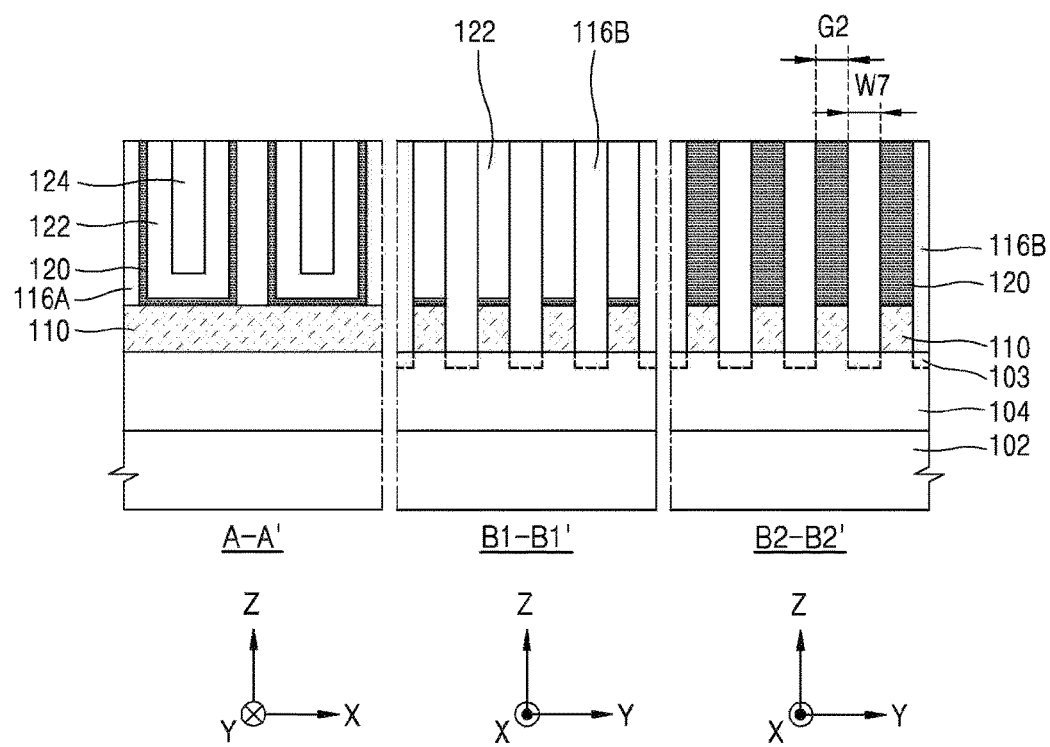

[FIG. 13]
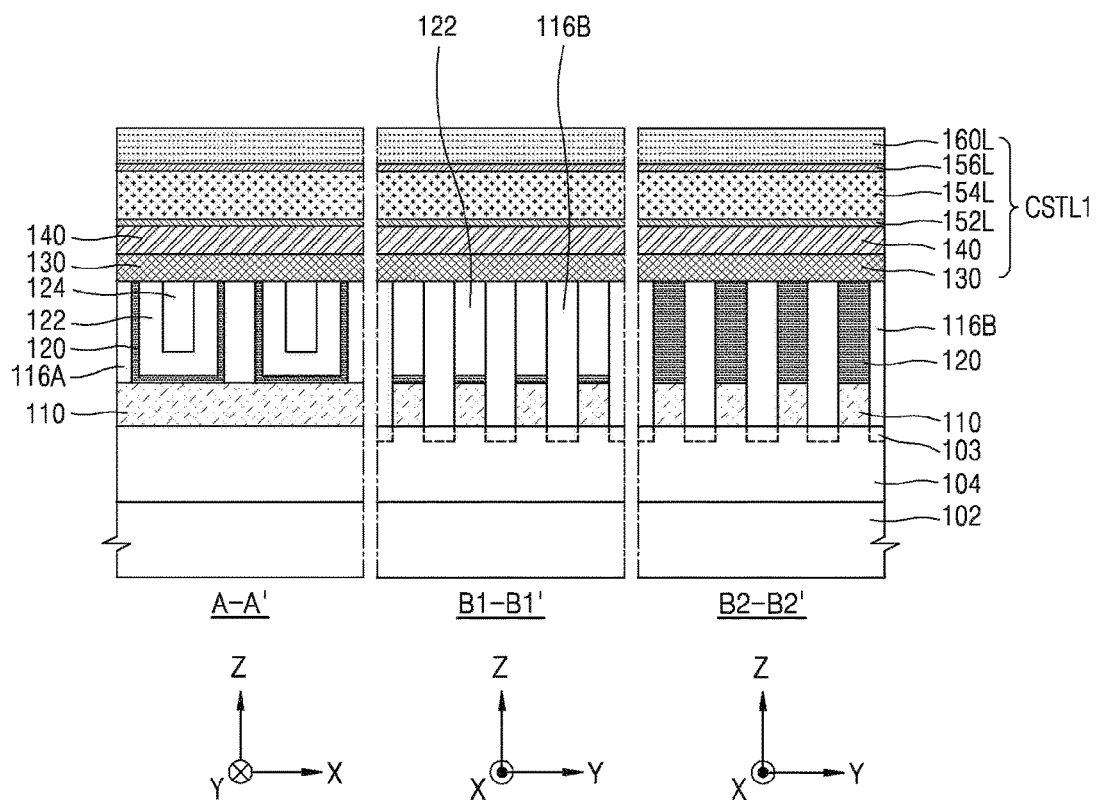

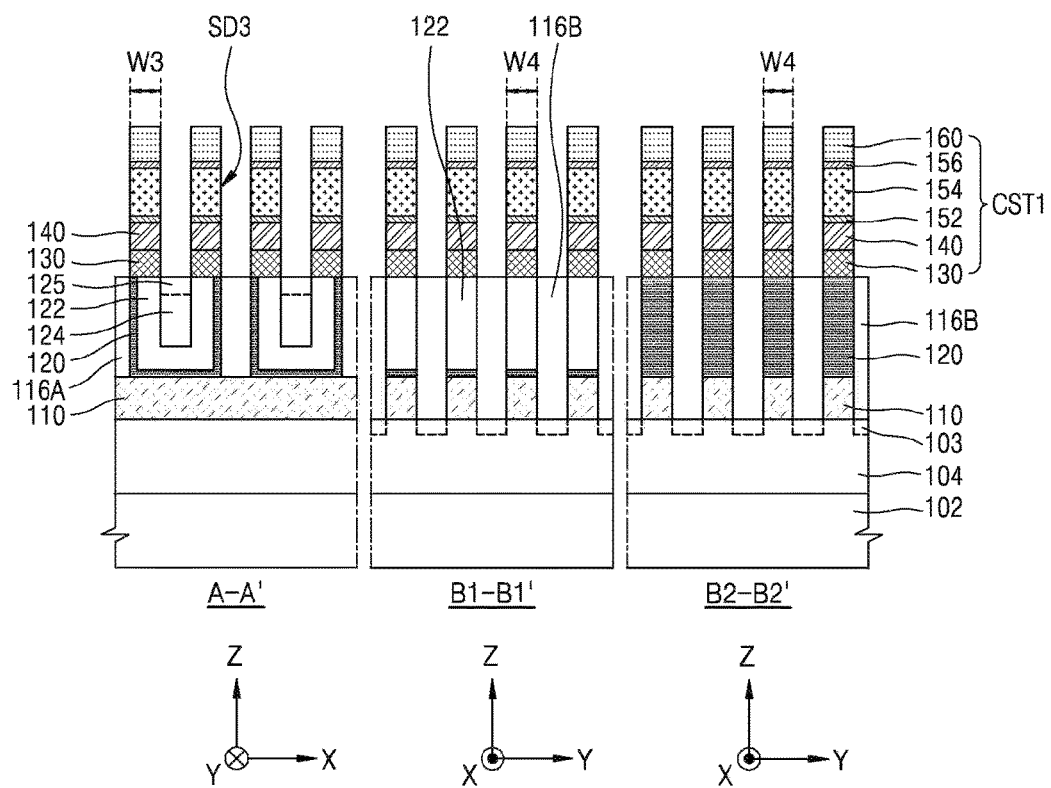
[FIG. 14]

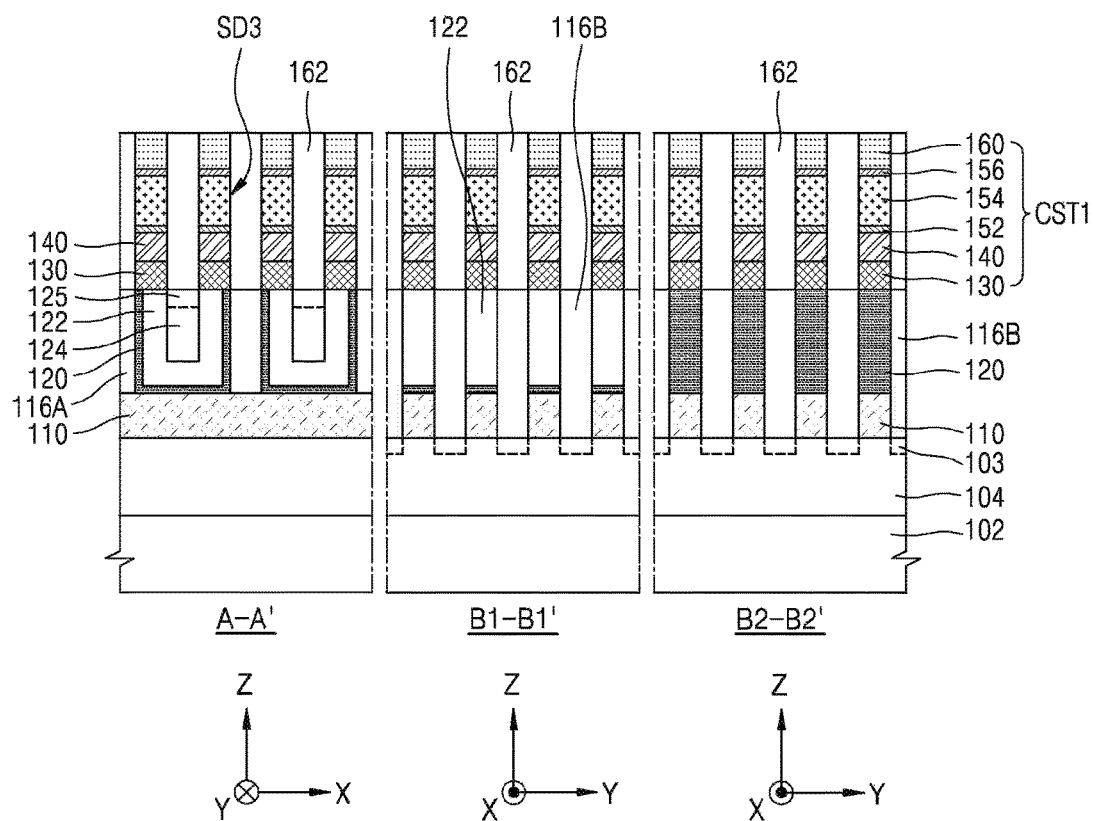
[FIG. 15]

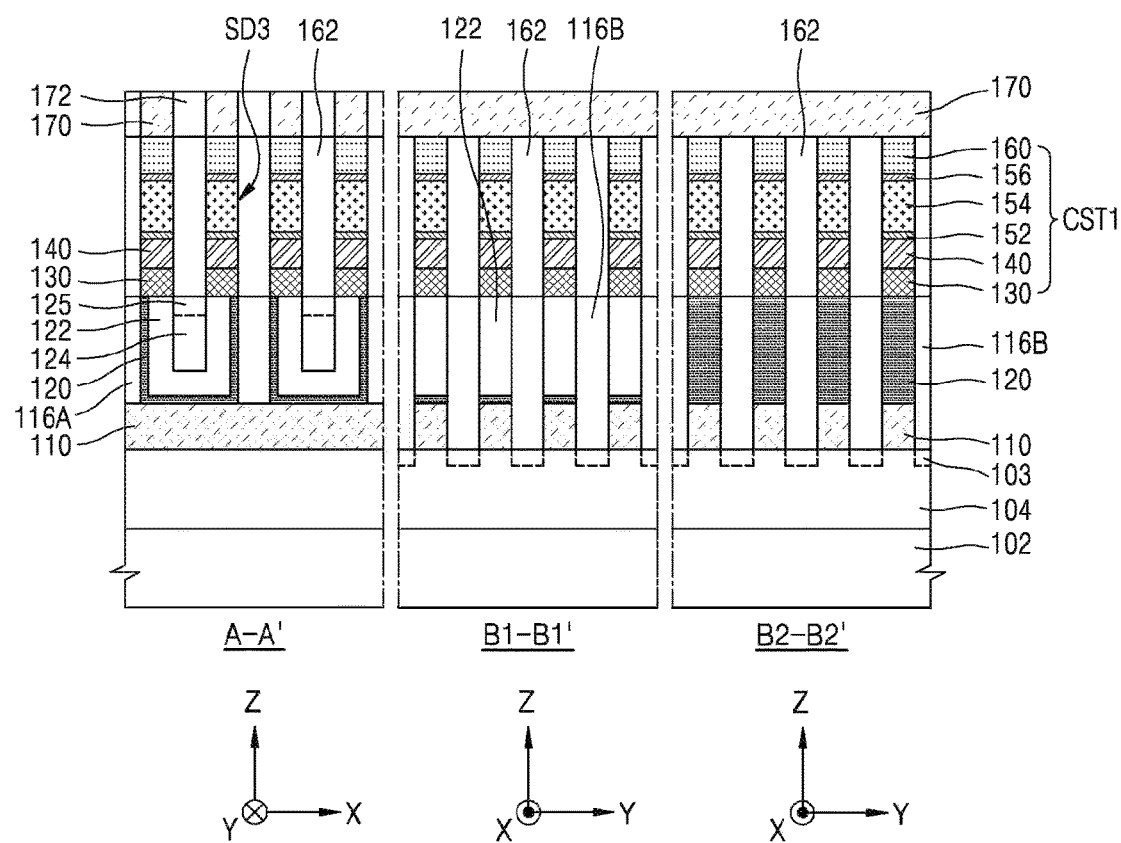
[FIG. 16]

[FIG. 17]
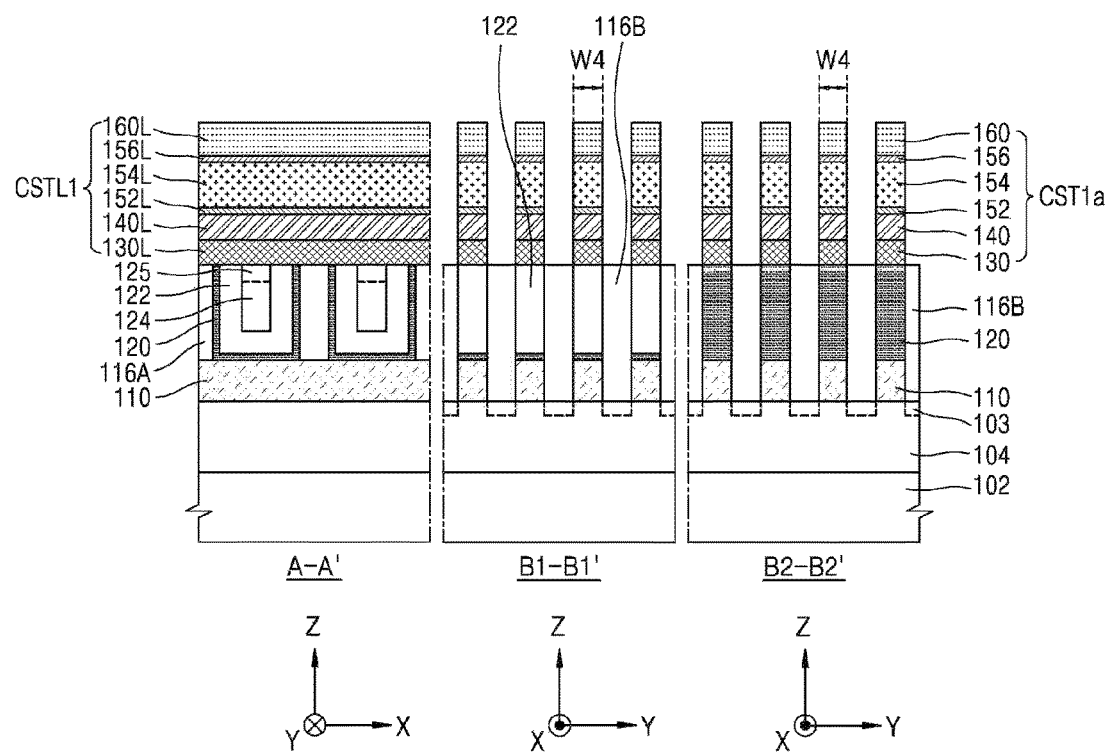

[FIG. 18]
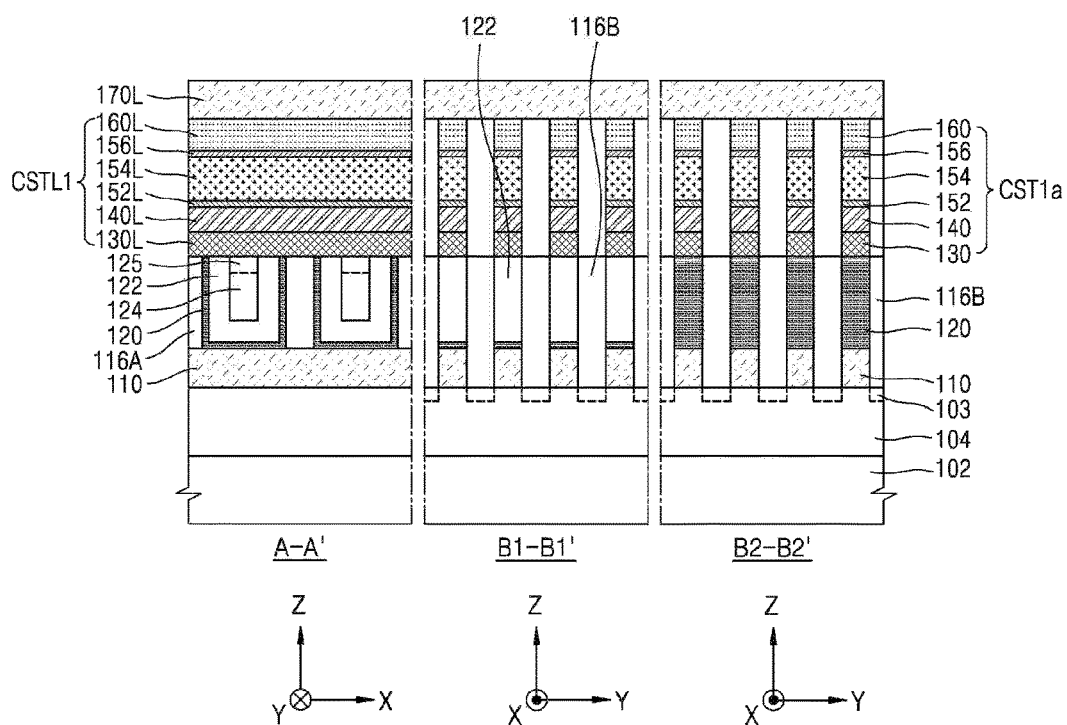

[FIG. 19]
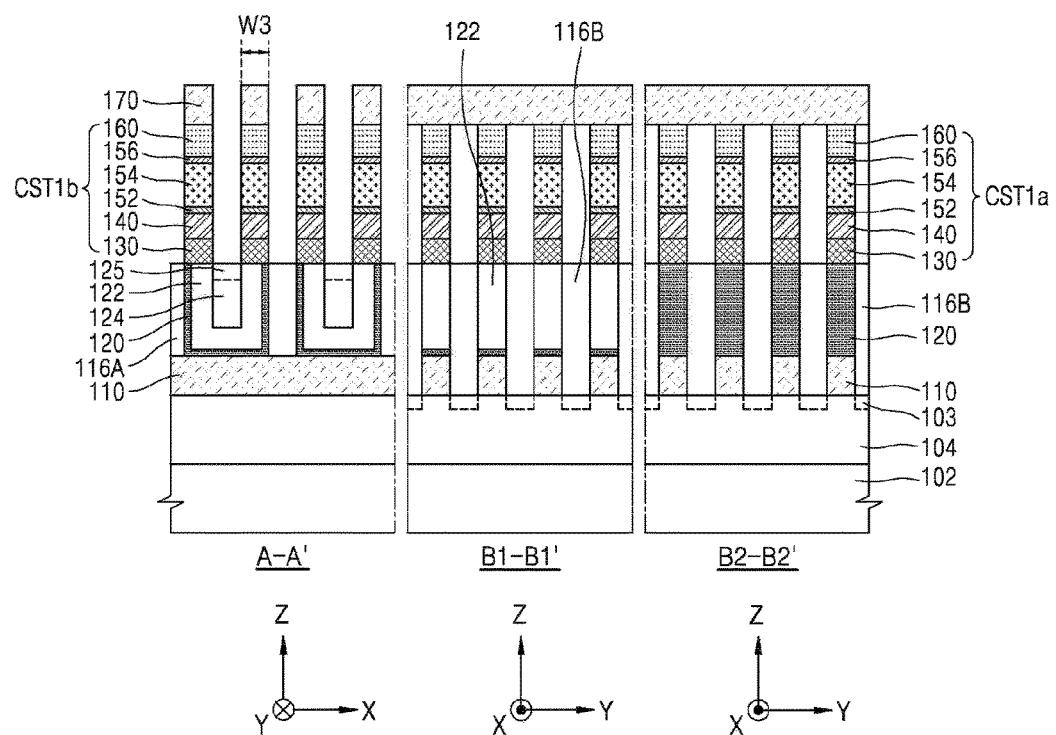

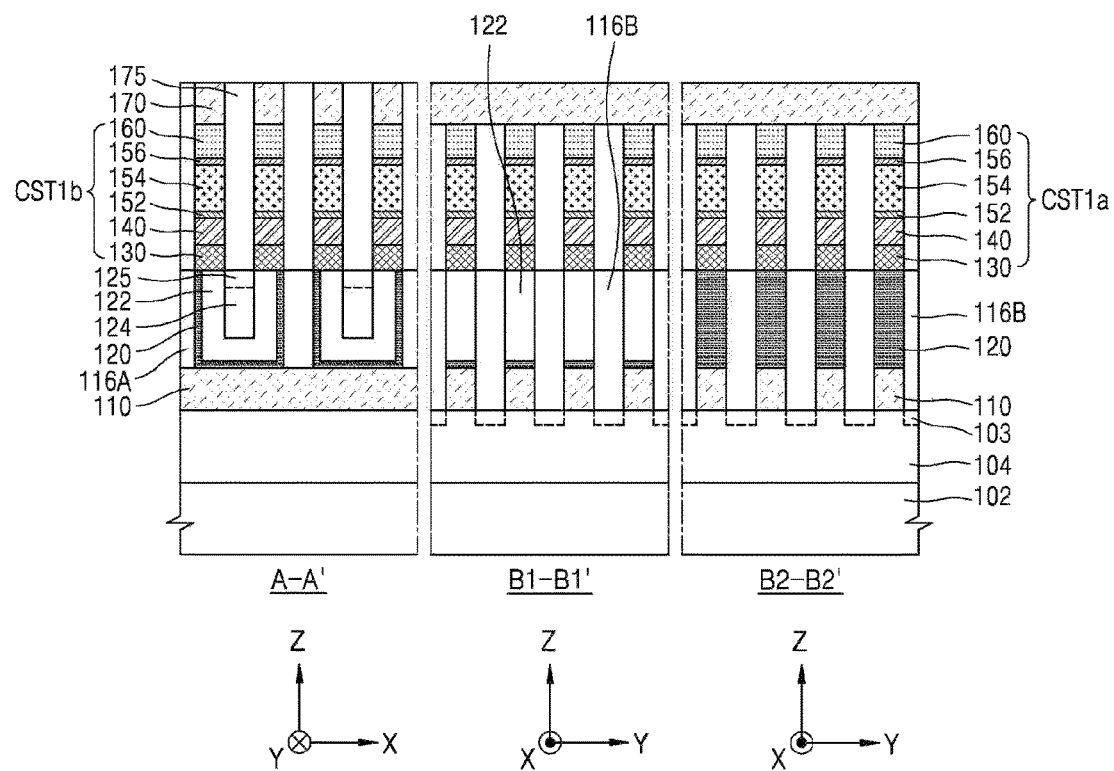
[FIG. 20]

[FIG. 21]
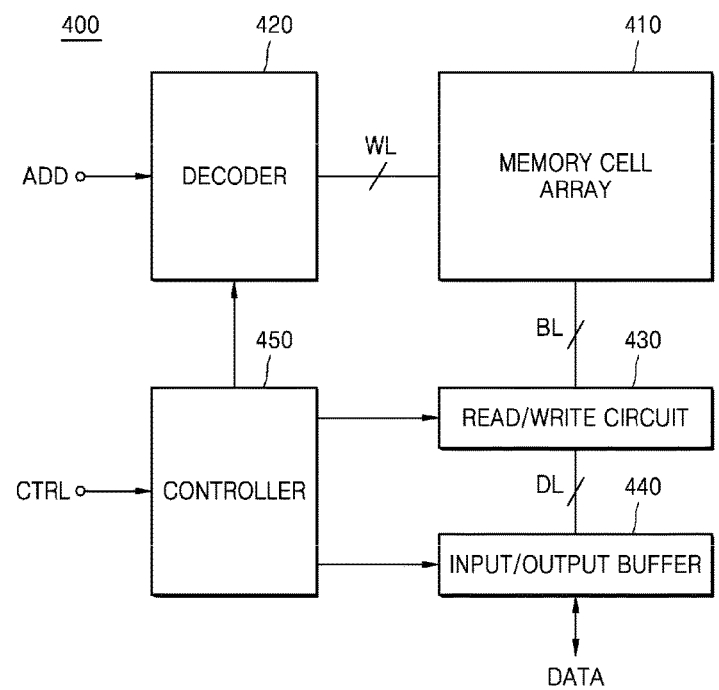

[FIG. 22]
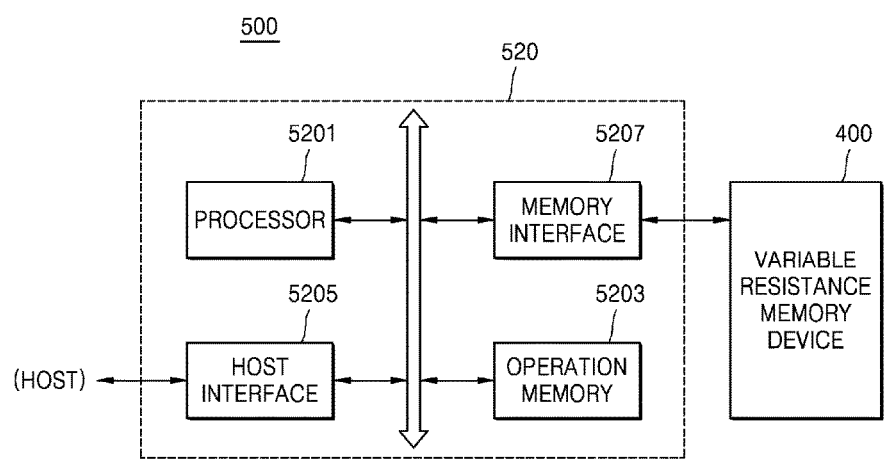
[FIG. 23]
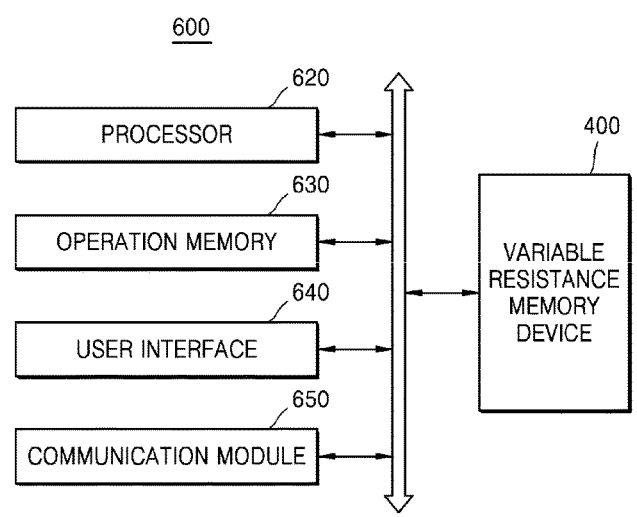

VARIABLE RESISTANCE MEMORY DEVICE AND METHOD OF MANUFACTURING THE SAME

CROSS-REFERENCE TO RELATED APPLICATION

This application claims priority under 35 U.S.C. § 119 to Korean Patent Application No. 10-2017-0084407, filed on Jul. 3, 2017, in the Korean Intellectual Property Office, the disclosure of which is incorporated herein in its entirety by reference.

BACKGROUND

The inventive concepts relate to variable resistance memory devices and/or methods of manufacturing the same, and more particularly, to variable resistance memory devices capable of improving reliability while reducing power consumption, and/or methods of manufacturing the same.

A variable resistance memory device has attracted the attention as a substitute for a flash memory device by utilizing current transfer characteristics of a variable resistance layer in response to an applied voltage. A typical example of the variable resistance memory device includes phase change random-access memory (RAM) (PRAM), resistance RAM (RRAM), or the like. Because such variable resistance memory devices are desired to be highly integrated and to be continuously scaled down, there has been a desire to develop a variable resistance memory structure capable of improving reliability while reducing power consumption.

SUMMARY

The inventive concepts provide variable resistance memory devices capable of improving reliability while reducing power consumption.

In addition, the inventive concepts provide methods of manufacturing a variable resistance memory device capable of improving reliability while reducing power consumption.

According to an aspect of the inventive concepts, a variable resistance memory device may include a first conductive line on a substrate, the first conductive line extending in a first direction, a second conductive line on the first conductive line, the second conductive line extending in a second direction, the second direction being a direction crossing the first direction, and a memory cell pillar connected to the first conductive line and the second conductive line at an intersection point therebetween, the memory cell pillar including a heating electrode layer and a variable resistance layer, the variable resistance layer in contact with the heating electrode layer, two opposite sidewalls of the heating electrode layer aligned with two opposite sidewalls of the first conductive line in the first direction, respectively.

According to another aspect of the inventive concepts, a variable resistance memory device may include a plurality of first conductive lines extending in a first direction, the plurality of first conductive lines spaced apart from each other in a second direction perpendicular to the first direction, a plurality of second conductive lines extending in the second direction above the first conductive lines, the plurality of second conductive lines spaced apart from each other in the first direction, and a plurality of memory cell pillars at intersections between the first conductive lines and the second conductive lines, the memory cell pillars spaced apart from each other, the memory cell pillars connected to the first conductive lines and the second conductive lines, the memory cell pillars including a heating electrode layer and a variable resistance layer in contact with the heating electrode layer, two opposite sidewalls of the heating electrode layer aligned with two opposite sidewalls of the first conductive line in the first direction, and a width of the heating electrode layer being equal to that of the first conductive line in the second direction.

According to another aspect of the inventive concepts, a method of manufacturing a variable resistance memory device may include forming a first conductive layer on a substrate, forming first insulating patterns on the first conductive layer, the first insulating patterns spaced apart from each other in a first direction, forming a heating electrode material layer, an insulating spacer layer, and a gap-fill insulating material layer between the first insulating patterns on a first area of the first conductive layer in the first direction, and forming the heating electrode material layer and the insulating spacer layer on a second area of the first conductive layer in the first direction and in a second direction perpendicular to the first direction, respectively, forming heating electrode layers, insulating spacers, and gap-fill insulating layers between sidewalls of the first insulating patterns by patterning the heating electrode material layer, the insulating spacer layer, the gap-fill insulating material layer, and the first conductive layer, and forming first conductive lines aligned with the heating electrode layers in the first direction and spaced apart from each other in the second direction, forming second insulating patterns extending in the first direction between the heating electrode layers, the insulating spacers, and the first conductive lines, forming a cell stack material layer on the heating electrode layers, the insulating spacers, and the gap-fill insulating layers, the cell stack material including a variable resistance material layer, forming a plurality of cell stack structures separated from each other in the first and second directions by patterning the cell stack material layer, each of the plurality of cell stack structures including a variable resistance layer by patterning the variable resistance material layer, forming third insulating patterns between the cell stack structures, the third insulating patterns configured to insulate the cell stack structures in the first direction and the second direction, respectively, forming a second conductive layer on the cell stack structures and the third insulating patterns, and forming a plurality of second conductive lines extending in the second direction on the cell stack structures and spaced apart from each other in the first direction by patterning the second conductive layer.

According to another aspect of the inventive concepts, a variable resistance memory device may include a plurality of first conductive lines extending in a first direction, the plurality of first conductive lines spaced apart from each other in a second direction perpendicular to the first direction; a plurality of second conductive lines extending in the second direction above the first conductive lines, the plurality of second conductive lines spaced apart from each other in the first direction; and a plurality of memory cell pillars at intersections between the first conductive lines and the second conductive lines, the memory cell pillars spaced apart from each other, the memory cell pillars connected to the first conductive lines and the second conductive lines, the memory cell pillars including a heating electrode layer and a variable resistance layer in contact with the heating electrode layer, two opposite sidewalls of the heating electrode layer aligned with two opposite sidewalls of the first conductive line, and the heating electrode layer being in contact with a portion of a bottom surface of the variable resistance layer in the first direction and being in contact with an entirety of the bottom surface of the variable resistance layer in the second direction.

BRIEF DESCRIPTION OF THE DRAWINGS

Example embodiments of the inventive concepts will be more clearly understood from the following detailed description taken in conjunction with the accompanying drawings in which:

FIG. 1 is an equivalent circuit diagram of a variable resistance memory device according to an example embodiment of the inventive concepts;

FIG. 2 is a plan layout view of a variable resistance memory device according to an example embodiment of the inventive concepts;

FIGS. 3A through 3E are drawings for explaining a configuration of a variable resistance memory device according to an example embodiment of the inventive concepts;

FIGS. 4A and 4B are drawings for explaining a variable resistance memory device according to another example embodiment of the inventive concepts;

FIG. 6 is a drawing for explaining a variable resistance memory device according to another example embodiment of the inventive concepts;

FIGS. 8 through 16 are cross-sectional views illustrating a method of manufacturing a variable resistance memory device according to a process sequence according to an example embodiment of the inventive concepts;

FIGS. 17 through 20 are cross-sectional views illustrating a method of manufacturing a variable resistance memory device according to a process sequence according to an example embodiment of the inventive concepts;

FIG. 21 is a configuration diagram of a variable resistance memory device according to an example embodiment of the inventive concepts;

FIG. 22 is a configuration diagram of a data processing system including a variable resistance memory device according to an example embodiment of the inventive concepts; and FIG. 23 is a configuration diagram of a data processing system including a variable resistance memory device according to an example embodiment of the inventive concepts.

DETAILED DESCRIPTION

Figure 3A:
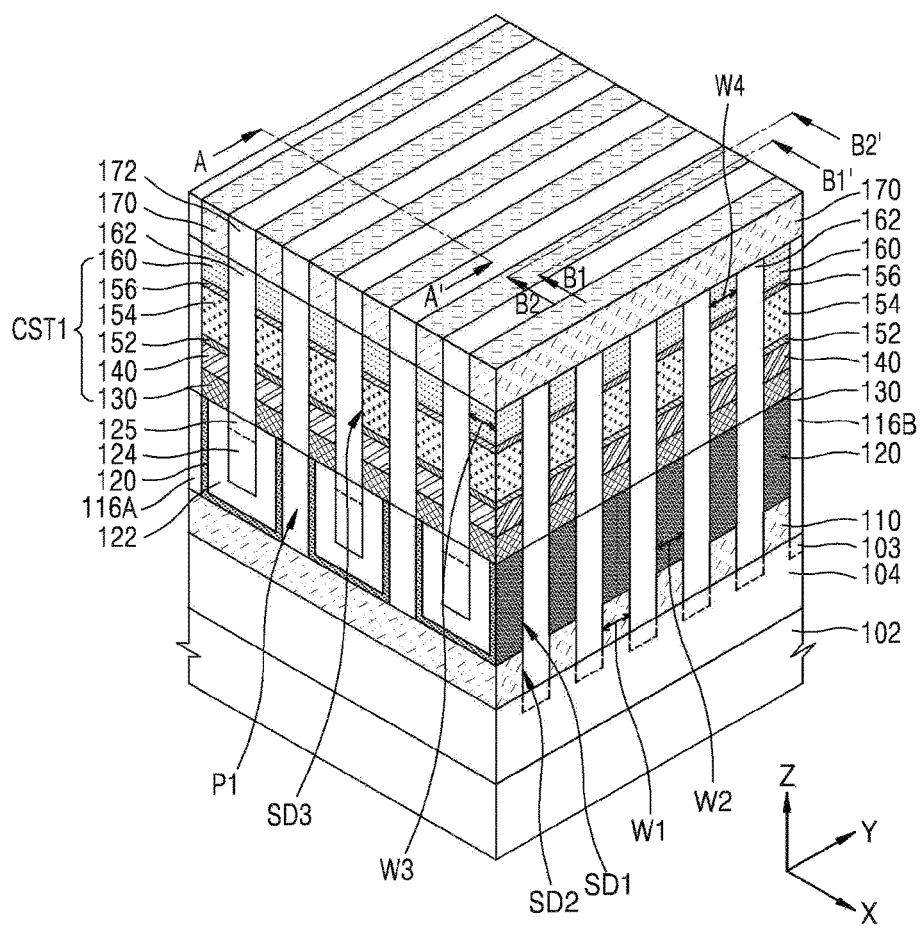

Below, the inventive concepts will now be described more fully with reference to the accompanying drawings, in which some example embodiments of the inventive concepts are shown. The present inventive concepts may be implemented by any one of the following example embodiments, or may be implemented by combining one or more of the following example embodiments. Therefore, the present inventive concepts are not limited to only one of the following example embodiments. In this disclosure, the singular forms of the components may include plural forms unless the context clearly indicates otherwise.

FIG. 1 is an equivalent circuit diagram of a variable resistance memory device 10 according to an example embodiment of the inventive concepts.

The variable resistance memory device 10 may include a plurality of word lines WL1 and WL2 extending in a first direction (X direction) and spaced apart from each other in a second direction (Y direction) perpendicular to the first direction (X direction). The variable resistance memory device 10 may be spaced apart from the word lines WL1 and WL2 in a third direction (Z direction), extend in the second direction (Y direction) perpendicular to the first direction (X direction), and include a plurality of bit lines BL1, BL2, BL3, and BL4 spaced apart from each other in the first direction (X direction). The third direction (Z direction) may be a direction perpendicular to the first direction (X direction) and the second direction (Y direction), and may be a direction perpendicular to the top surface of a substrate (refer to FIGS. 3A and 3B).

The word lines WL1 and WL2 may be referred to as first conductive lines (or first signal lines). The bit lines BL1, BL2, BL3, and BL4 may be referred to as second conductive lines (or second signal lines). Alternatively, the word lines WL1 and WL2 may be referred to as second conductive lines (or second signal lines). The bit lines BL1, BL2, BL3, and BL4 may be referred to as first conductive lines (or first signal lines).

Memory cells MC may be located between the bit lines BL1, BL2, BL3, and BL4 and the word lines WL1 and WL2, respectively. The memory cells MC may be located at intersections between the bit lines BL1, BL2, BL3, and BL4 and the word lines WL1 and WL2, respectively, and include a variable resistance layer ME for storing information and a selection device SW for selecting the memory cell MC. The selection device SW may also be referred to as a switching device or an access device.

The memory cells MC may constitute a single-layer memory cell array arranged in the first direction (X direction) and the second direction (Y direction). The variable resistance memory device 10 may include a memory cell array of a three-dimensional vertical structure in which a plurality of single-layer memory cell arrays are stacked in the third direction.

In the memory cell MC between the word line WL1 and the bit line BL1, the selection device SW may be electrically connected to the word line WL1 and the variable resistance layer ME may be electrically connected to the bit line BL1, and the variable resistance layer ME and the selection device SW may be connected to each other in series. However, the inventive concepts are not limited thereto. For example, unlike illustrated in FIG. 1, positions of the selection device SW and the variable resistance layer ME may be exchanged in the memory cell MC. Accordingly, in the memory cell MC, the variable resistance layer ME may be connected to the word line WL1 and the selection device SW may be connected to the bit line BL1.

A method of driving the variable resistance memory device 100 will be briefly described. A voltage may be applied to the variable resistance layer ME of the memory cell MC via the word lines WL1 and WL2 and the bit lines BL1, BL2, BL3, and BL4 so that current may flow through the variable resistance layer ME. The variable resistance layer ME may include, for example, a phase-change material layer which is capable of being reversibly switched between a first state and a second state.

However, variable resistance layers ME according to example embodiment are not limited thereto, and may include any variable resistors in which resistance varies according to an applied voltage. For example, in a selected memory cell MC, resistance of the variable resistance layer ME may be reversibly switched between the first state and the second state according to a voltage applied to the variable resistance layer ME.

Digital information, like '0' or '1', may be stored in the memory cell MC depending on a variation in resistance of the variable resistance layer ME. In addition, digital information may be erased from the memory cell MC. For example, data may be written as a high-resistance state '0' or a low-resistance state '1' in the memory cell MC. Here an operation of writing the high-resistance state '0' into the low-resistance state '1' may be referred to as a 'set operation', and an operation of writing the low-resistance state '1' into the high-resistance state '0' may be referred to as a 'reset operation'. However, data of the memory cell MC according to example embodiments of the inventive concepts are not limited to the above-described digital information, and may store, for example, the high-resistance state '0' and the low-resistance state '1', and various resistance states.

An arbitrary memory cell MC may be addressed by selecting the word lines WL1 and WL2 and the bit lines BL1, BL2, BL3, and BL4. The memory cell MC may be programmed by applying a certain signal between the word lines WL1 and WL2 and the bit lines BL1, BL2, BL3, and BL4. Information (e.g., programmed information), according to resistance of a corresponding variable resistance layer ME of the memory cell MC may be read by measuring currents passing through the bit lines BL1, BL2, BL3, and BL4.

FIG. 2 is a plan layout view of a variable resistance memory device 100 according to an example embodiment of the inventive concepts.

The variable resistance memory device 100 illustrated in FIG. 2 may have the same equivalent circuit configuration as the variable resistance memory device 10 illustrated in FIG. 1. The variable resistance memory device 100 may include a plurality of first conductive lines 110 extending in parallel with each other in the first direction (X direction) on a substrate (refer to 102 in FIGS. 3A and 3B). The first conductive lines 110 may extend in the first direction (X direction) and may be spaced apart from each other in the second direction (Y direction) perpendicular to the first direction (X direction).

The variable resistance memory device 100 may include a plurality of second conductive lines 170 extending in parallel with each other in the second direction (Y direction) that intersects the first direction (X direction) on the first conductive lines 110. The second conductive lines 170 may extend in the second direction (Y direction) and be spaced apart from each other in the first direction (X direction) perpendicular to the second direction (Y direction). In the present example embodiment, a case where the first direction (X direction) and the second direction (Y direction) are perpendicular to each other is described as an example, but the inventive concepts are not limited thereto.

According to an example embodiment, the first conductive lines 110 may constitute word lines WL1 and WL2 illustrated in FIG. 1 and the second conductive lines 170 may constitute bit lines BL1, BL2, BL3, and BL4 illustrated in FIG. 1. According to another example embodiment, the first conductive lines 110 may constitute the bit lines BL1, BL2, BL3 and BL4, and the second conductive lines 170 may constitute the word lines WL1 and WL2.

The first conductive lines 110 and the second conductive lines 170 may include a metal, a conductive metal nitride, a conductive metal oxide, or a combination thereof. The first conductive lines 110 and the second conductive lines 170 may include any one of W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, ITO, an alloy thereof, or a combination thereof. The first conductive lines 110 and the second conductive lines 170 each may further include a conductive barrier layer. The conductive barrier layer may include, for example, Ti, TiN, Ta, TaN, or a combination thereof.

Memory cell pillars P1 constituting the memory cell MC and being spaced apart from each other may be arranged at a plurality of intersections between the first conductive lines 110 and the second conductive lines 170. A configuration of the variable resistance memory device 100 of FIG. 2 including the memory cell pillars P1 will be described below in detail.

FIGS. 3A through 3E are drawings for explaining a configuration of a variable resistance memory device according to an example embodiment of the inventive concepts.

Figure 3B:
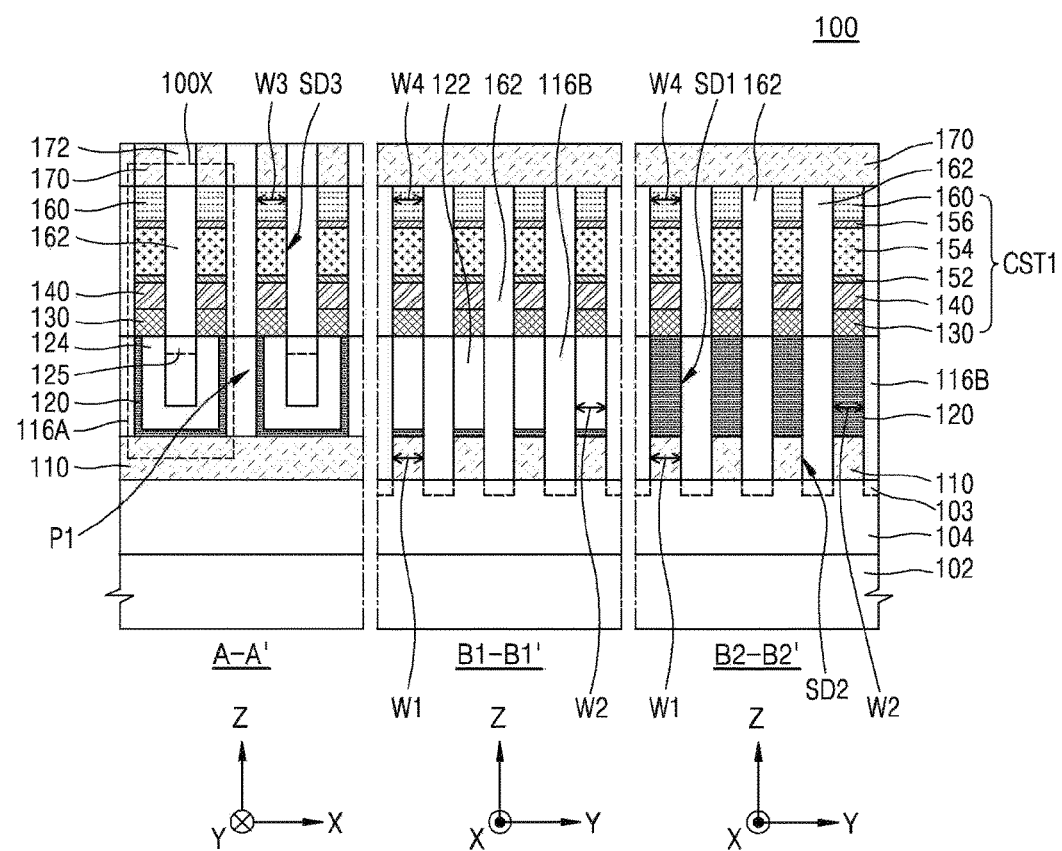
Figure 3D:
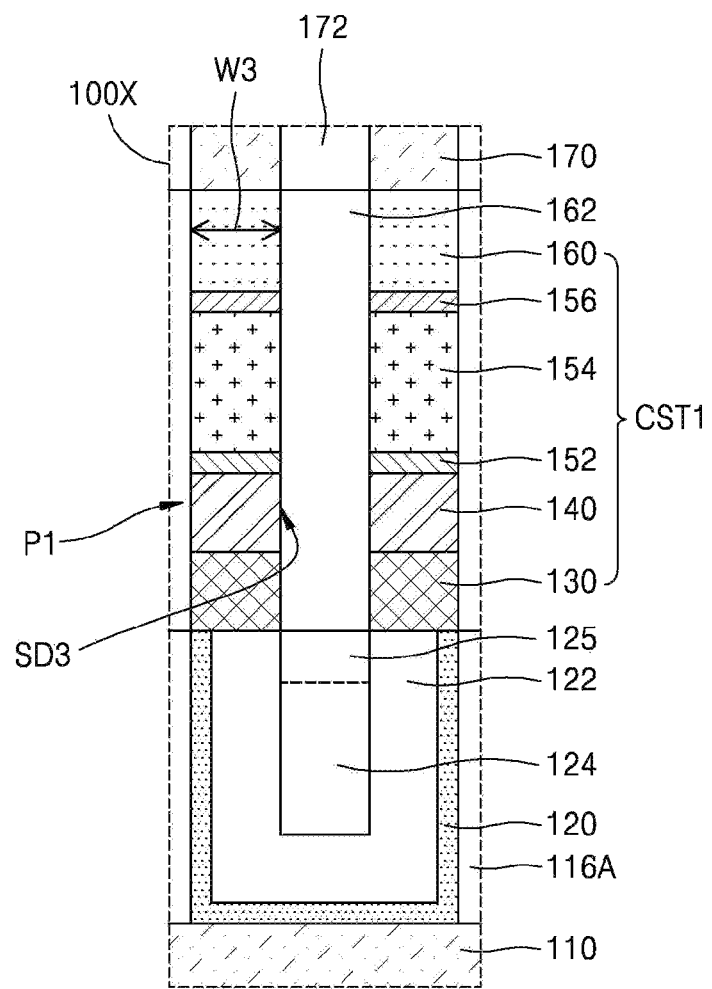
Figure 3E:
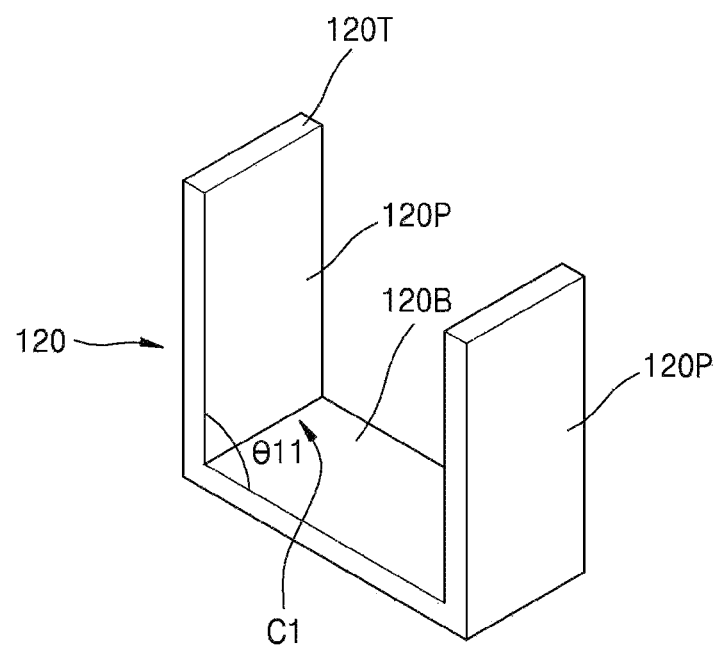

FIG. 3A is a perspective view showing a configuration of main components of the variable resistance memory device 100 of FIG. 2. FIG. 3B shows cross-sectional views of main components in cross-sections taken along a line A-A', a line B1-B1', and a line B2-B2' in FIGS. 2 and 3A. FIG. 3C is a plan layout view illustrating a mutual arrangement relationship of the first conductive line 110, the top surface level of a heating electrode layer 120, and the second conductive line 170 of the variable resistance memory device 100 of FIG. 2. FIG. 3D is an enlarged cross-sectional view of a dashed line region 100X of FIG. 3B. FIG. 3E is a schematic perspective view of the heating electrode layer 120 of FIGS. 3A and 3B.

The variable resistance memory device 100 may include an interlayer insulating layer 104 on the substrate 102, as illustrated in FIGS. 3A and 3B. The interlayer insulating layer 104 may electrically separate the first conductive line 110 from the substrate 102, and may include an oxide layer, a nitride layer, or a combination thereof.

The first conductive lines 110 may extend in the first direction (X direction) and may be separated from each other in the second direction (Y direction) perpendicular to the first direction (X direction). A second insulating pattern 116B may be formed between the first conductive lines 110. The second insulation pattern 116B may separate the heating electrode layers 120 in the second direction (Y direction). The second insulating pattern 116B may be formed as a planarized insulating layer pattern in a subsequent manufacturing process. A memory cell pillar P1 constituting the memory cell (MC in FIG. 2) may be arranged at a plurality of intersection points between the first conductive lines 110 and the second conductive lines 170. The memory cell pillars P1 are illustrated having a square pillar shape. However, shapes thereof may be any one of a cylinder, an elliptic column, or a polygonal column.

The memory cell pillar P1 may be connected to the first conductive line 110 and the second conductive line 170. The memory cell pillar P1 may include the heating electrode layer 120 on the first conductive line 110 and a cell stacked structure CST1 on the heating electrode layer 120.

The first conductive line 110 may extend with a first width W1 in the first direction (X direction), as illustrated in FIGS. 3A through 3C. The heating electrode layer 120 may extend with a second width W2 in the second direction (Y direction), as illustrated in FIGS. 3A through 3C. The second width W2 of the heating electrode layers 120 in the second direction (Y direction) may be the same as the first width W1 of the first conductive lines 110. Both sidewalls SD2 of the heating electrode layer 120 may be aligned with both sidewalls SD1 of the first conductive line 110 in the first direction (X direction), respectively.

Both sidewalls SD2 of the heating electrode layer 120 may be aligned with both sidewalls SD1 of the first conductive line 110, respectively, in the first direction (X direction), and the second width W2 of the heating electrode layer 120 may be the same as the first width W1 of the first conductive line 110 in the second direction (Y direction). This may be possible, as described below, because an etching process among manufacturing processes can be simultaneously performed on a heating electrode material layer and a first conductive layer in the first direction (X direction).

In this manner, a bridge between the heating electrode layers 120 and the first conductive lines 110 due to misalignment between the heating electrode layer 120 and the first conductive lines 110 in the second direction (Y direction) may be prevented, and thus, reliability of the variable resistance memory device 100 may be improved. In some embodiments, a bridge between the heating electrode layers 120 due to misalignment between the heating electrode layers 120 in the second direction (Y direction) may be prevented, thereby improving reliability of the variable resistance memory device 100. In some embodiments, a bridge between the first conductive lines 110 due to misalignment between the first conductive lines 110 in the second direction (Y direction) may be prevented, thereby improving reliability of the variable resistance memory device 100.

In addition, when the heating electrode material layer and the first conductive layer are simultaneously etched in the first direction (X direction), a substrate recess portion 103 recessed from both the sidewalls SD1 of the first conductive line 110 may be formed on the substrate 102 in the first direction (X direction). Insulating performance between the first conductive lines 110 may be improved due to the substrate recess portion 103.

The cell stack structure CST1 may include a variable resistance layer 130 in contact with the heating electrode layer 120, a bottom electrode layer 140 on the variable resistance layer 130, a selection device layer 154 on the bottom electrode layer 140, and a top electrode layer 160 on the selection device layer 154. The cell stack structure CST1 may further include a first interface layer 152 on the bottom electrode layer 140 and a second interface layer 156 on the selection device layer 154.

The cell stack structure CST1 may have a third width W3 in the first direction (X direction), as illustrated in FIGS. 3A through 3C. The widths of the variable resistance layer 130 and the selection device layer 154 constituting the cell stack structure CST1 in the first direction (X direction) may be the same as the third width W3. The cell stack structure CST1 may have a fourth width W4 in the second direction (Y direction), as illustrated in FIGS. 3A through 3C. The widths of the variable resistance layer 130 and the selection device layer 154 constituting the cell stack structure CST1 in the second direction (Y direction) may be the same as the fourth width W4. The third width W3 in the first direction (X direction) and the fourth width W4 in the second direction (Y direction) of the cell stack structure CST1 may be equal to or different from each other.

The third and fourth widths W3 and W4 of the variable resistance layer 130 and the selection device layer 154 may be the same in the first direction (X direction) and the second direction (Y direction), respectively. This may be obtained by simultaneously etching the variable resistance material layer and the selection device material layer in a subsequent manufacturing process In this manner, etching damage of the variable resistance layer 130 and the selection device layer 154, in particular, the etching damage of the selection device layer 154 may be reduced, and reliability of the variable resistance memory device 100 may be improved.

In addition, when the variable resistance material layer and the selection device material layer are simultaneously etched in the first direction (X direction) and the second direction (Y direction), a gap-fill insulating layer 124 may be provided with a gap-fill recess portion 125 recessed with respect to both sidewalls SD3 of the cell stack structure CST1 in the second direction (Y direction). Accordingly, insulating performance between the cell stack structures CST1 may be improved due to the gap-fill recess portion 125.

The first interface layer 152 and the second interface layer 156 each may include a non-metallic material, for example, carbon (C). The first interface layer 152 and the second interface layer 156 each may be omitted in some example embodiments. The selection device layer 154 may correspond to the selection device SW illustrated in FIG. 1. The selection device layer 154 may include an amorphous chalcogenide switching material. The selection device layer 154 may include a material layer in which resistance varies depending on a magnitude of a voltage applied at both ends of the selection device layer 154.

For example, the selection device layer 154 may include an Ovonic threshold switching (OTS) material. The OTS material may include a chalcogenide switching material. In some example embodiments, the selection device layer 154 may include Si, Te, As, Ge, In, or a combination thereof. The selection device layer 154 may further include nitrogen atoms (N). Constituent material(s) of the selection device layer 154 is not limited to those described above, and the selection device layer 154 may include various material layers capable of selecting devices.

The cell stack structure CST1 may be separated by a third insulating pattern 162 in the first direction (X direction) and the second direction (Y direction). The third insulating pattern 162 may be planarized in a subsequent manufacturing process. The third insulating pattern 162 may extend in the first direction (X direction) and the second direction (Y direction).

As illustrated in FIGS. 3A and 3B, first insulating patterns 116A may be arranged in a line in the first direction (X direction) on the first conductive line 110, and a pair of memory cell pillars P1 may be arranged between the first insulating patterns 116A. The first insulating patterns 116A may include, as described below, insulating pattern layers formed by a photolithography process after an insulating material layer is formed on the interlayer insulating layer 104. The second insulating patterns 116B may extend in parallel with each other in the first direction (X direction), and the second insulating pattern 116B and the memory cell pillar P1 may be alternately arranged in the second direction (Y direction).

As illustrated in FIGS. 3A and 3B, the memory cell pillars P1 may be insulated from each other by the first insulating pattern 116A, the second insulating pattern 116B, and the third insulating pattern 162. The first insulating pattern 116A, the second insulating pattern 116B, and the third insulating pattern 162 may include a silicon oxide layer, a silicon nitride layer, or a combination thereof.

The second conductive lines 170 extending in the second direction (Y direction) and separated from each other in the first direction (X direction) may be formed on the memory cell pillars P1 and the third insulation pattern 162. The second conductive lines 170 may be separated by a fourth insulating pattern 172 extending in the second direction (Y direction). The fourth insulating pattern 172 may include a silicon oxide layer, a silicon nitride layer, or a combination thereof, similar to the first insulating pattern 116A, the second insulating pattern 116B, or the third insulating pattern 162 described above. The fourth insulating pattern 172 may be planarized in a subsequent manufacturing process.

The heating electrode layer 120 may be arranged to form a dash-shape pattern in the second direction (Y direction) on the first conductive line 110, as shown in FIG. 3C. The heating electrode layer 120 may have a substantially U cross-sectional shape in the first direction (X direction), as shown in FIGS. 3A, 3B, 3D, and 3E. Because the heating electrode layer 120 is arranged to form a dash-shape pattern, the heating electrode layer 120 may be in contact with a portion of the bottom surface of the variable resistance layer 130 in the first direction (X direction), and may be in contact with an entire bottom surface of the variable resistance layer 130 in the second direction (Y direction). Accordingly a contact area between the heating electrode layers 120 and the variable resistance layer 130 may be reduced, and thus power consumption may be reduced.

As illustrated in FIG. 3E, the heating electrode layer 120 may include a base portion 120B extending in parallel with the first conductive lines 110 and two fin portions 120P extending in a direction away from the first conductive lines 110 at both ends of the base portion 120B. The fin portion 120P may extend substantially perpendicularly to a main surface of the substrate 102, and an angle of incidence θ11 between the base portion 120B and the fin portion 120P may be a right angle. The fin portion 120P may be on the first conductive lines 110, and may be in contact with the first insulation pattern 116A and the memory cell pillar P1. A top contact surface 120T of the fin portion 120P may contact the bottom surface of the heating electrode layer 120.

In the variable resistance memory device 100, one heating electrode layer 120 may be shared by two memory cell pillars P1. A central portion of the base portion 120b may be cut so that one heating electrode layer 120 is connected to only one memory cell pillar P1, as desired. In this case, one fin portion 120P may contact a portion of the bottom surface of the variable resistance layer 130 in the first direction (X direction) and contact the whole bottom surface of the variable resistance layer 130 in the second direction (Y direction).

An insulating spacer 122 and a gap-fill insulating layer 124 may be sequentially stacked on each of one of the heating electrode layers 120, which are shared by two memory cell pillars P1. The two memory cell pillars P1 sharing one of the heating electrode layers 120 may be insulated from each other by the insulating spacer 122 and the gap-fill insulating layer 124. The insulating spacer 122 may be in contact with the bottom surface and the sidewall of the heating electrode layer 120, and be in contact with the bottom surface of the variable resistance layer 130. The insulating spacer 122 may have a substantially U cross-sectional shape.

The insulating spacer 122 may include a material having an etch selectivity with respect to a constituent material of the first insulating pattern 116A and the second insulating pattern 116B, and the gap-fill insulating layer 124 may include a material having the same or substantially similar etch selectivity to the constituent material of the first insulating pattern 116A and the second insulating pattern 116B.

For example, the first insulation pattern 116A, the second insulation pattern 116B, and the gap-fill insulating layer 124 may include a silicon nitride layer, and the insulating spacer 122 may include a silicon oxide layer. However, example embodiments of the present inventive concepts are not limited thereto.

The heating electrode layer 120 may heat the variable resistance layer 130 in a set or reset operation. The heating electrode layer 120 may include a conductive material that can generate sufficient heat for a phase change of the variable resistance layer 130 without reacting with the variable resistance layer 130. The heating electrode layer 120 may include a metal, a metal nitride, an alloy, or a carbon-based conductive material. For example, the heating electrode layer 120 may include any one of TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, WON, TaON, C, SiC, SiCN, CN, TiCN, TaCN, or a combination thereof.

The variable resistance layer 130 may include a phase change material that reversibly changes between an amorphous state and a crystalline state depending on a heating time. For example, the variable resistance layer 130 may have a phase that is reversibly changed by Joule heat generated by the voltage applied to both ends thereof and may include a material in which resistance can be changed by this phase change.

In some example embodiments, the variable resistive layer 130 may include a chalcogenide material as a phase change material. In some example embodiments, the variable resistance layer 130 may include Ge—Sb—Te (GST). For example, Ge—Sb—Te of the variable resistance layer 130 may include a material such as $Ge_2Sb_2Te_5$, $Ge_2Sb_2Te_7$, $GeSb_2Te_4$, and $GeSb_4Te_7$.

The variable resistance layer 130 may include various chalcogenide materials in addition to the Ge—Sb—Te (GST) described above. For example, the variable resistance layer 130 may be a chalcogenide material and include a material containing at least two elements of Si, Ge, Sb, Te, Bi, In, Sn, and Se.

In some example embodiments, the variable resistance layer 130 may further include at least one impurity of B, C, N, O, P, or S. A driving current of the variable resistance memory device 100 may be changed by impurities. The variable resistance layer 130 may further include a metal. For example, the variable resistance layer 130 may include at least one metal of Al, Ga, Zn, Ti, Cr, Mn, Fe, Co, Ni, Mo, Ru, Pd, Hf, Ta, Ir, Pt, Zr, Tl, Pd, or Po. In some example embodiments, the variable resistance layer 130 may have a multilayer structure in which two or more layers having different physical properties from each other are stacked. The number or thickness of a plurality of layers constituting the multilayer structure may be freely selected. For example, the variable resistance layer 130 may have a super lattice structure in which the plurality of layers including different materials from each other are alternately stacked.

A constituent material of the variable resistance layer 130 may not be limited to the phase change material. The variable resistance layer 130 may include various materials having resistance change characteristics. In some example embodiments, the variable resistance layer 130 may include a transition metal oxide, and in this case, the variable resistance memory device 100 may constitute a resistive random-access memory (RAM) (ReRAM) device.

In some other example embodiments, the variable resistance layer 130 may have a magnetic tunnel junction (MTJ) structure which includes two magnetic material electrodes including a dielectric material between the two magnetic material electrodes. In this case, the variable resistance memory device 100 may constitute a magnetic RAM (MRAM) device.

The bottom electrode layer 140 and the top electrode layer 160 may include a metal, a conductive metal nitride, a conductive metal oxide, or a combination thereof. For example, the bottom electrode layer 140 and the top electrode layer 160 may include one of W, Ti, Ta, Al, Cu, C, CN, TiN, TiAlN, TiSiN, TiCN, TiCSiN, WN, CoSiN, WSiN, TaN, TaCN, TaSiN, or a combination thereof.

In one memory cell pillar P1, the cell stack structure CST1 may be aligned with the sidewalls of the first insulating pattern 116A. The insulating spacer 122 may be arranged so as to be in contact with inner surfaces of the fin portion 120P and the base portion 120B of the heating electrode layer 120, and the bottom surface of the variable resistance layer 130. The fin portion 120P may be spaced apart from the gap-fill insulating layer 124 by the insulating spacer 122 therebetween. A bottom surface of the insulating spacer 122 may contact the base portion 120B of the heating electrode layer 120 and a top surface of the insulating spacer 122 may contact the bottom surface of the variable resistance layer 130.

The insulating spacer 122 may be arranged so as to fill a reentrant corner portion C1 between the base portion 120B and the fin portion 120P of the heating electrode layer 120.

The variable resistance memory device 100 may have a reduced contact area between the heating electrode layer 120 and the variable resistance layer 130 via a contact between the fin portion 120P of the heating electrode layer 120 and the bottom surface of the variable resistance layer 130, and a heating efficiency thereof may be increased when a current is applied through the heating electrode layer 120. Accordingly, the variable resistance memory device 100 having a cross-point stack structure may consume less power by reducing a reset current due to the fin portion 120P of the heating electrode layer 120, and thus reliability of the variable resistance memory device 100 may be improved by increasing the heating efficiency during the switching operation.

FIGS. 4A and 4B are drawings for explaining a variable resistance memory device 100-1 according to another example embodiment of the inventive concepts.

FIG. 4A shows cross-sectional views illustrating main components of portions corresponding to A-A' cross-section, B1-B1' cross-section, and B2-B2' cross-section in FIG. 2. FIG. 4B is an enlarged cross-sectional view of a dashed line region 100X-1 of FIG. 4A. In FIGS. 4A and 4B, the same reference numerals as those in FIGS. 3A through 3E may denote the same members. The variable resistance memory device 100-1 may have substantially the same configuration as the variable resistance memory device 100 described with reference to FIGS. 3A through 3E.

However, the variable resistance memory device 100-1 may include the second conductive line 170 extending in the second direction (Y direction) as illustrated in the cross-sections in the first direction (X direction) of FIG. 4A. The second conductive line 170 may have a fifth width W5 in the first direction (X direction). The fifth width W5 of the second conductive line 170 in the first direction (X direction) may be the same as the third width W3 of the cell stack structure CST1. Both sidewalls SD4 of the second conductive line 170 may be aligned with both the sidewalls SD3 of the cell stack structure CST1 in the second direction (Y direction).

The third width W3 of the cell stack structure CST1 and the fifth width W5 of the second conductive line 170 may be the same in the first direction (X direction). This may be obtained by simultaneously etching the second conductive layer and the cell stack material layer in the second direction (Y direction) in a subsequent manufacturing process. In addition, a fifth insulating pattern 175 may be formed between the cell stack structures CST1 and the second conductive lines 170 in the second direction (Y direction). The fifth insulating pattern 175 may be planarized in a subsequent manufacturing process. In this manner, etching damage of the variable resistance layer 130 or the selection device layer 154 (e.g., the etching damage of the selection device layer 154) may be reduced, thereby improving reliability of the variable resistance memory device 100-1.

Figure 5A:
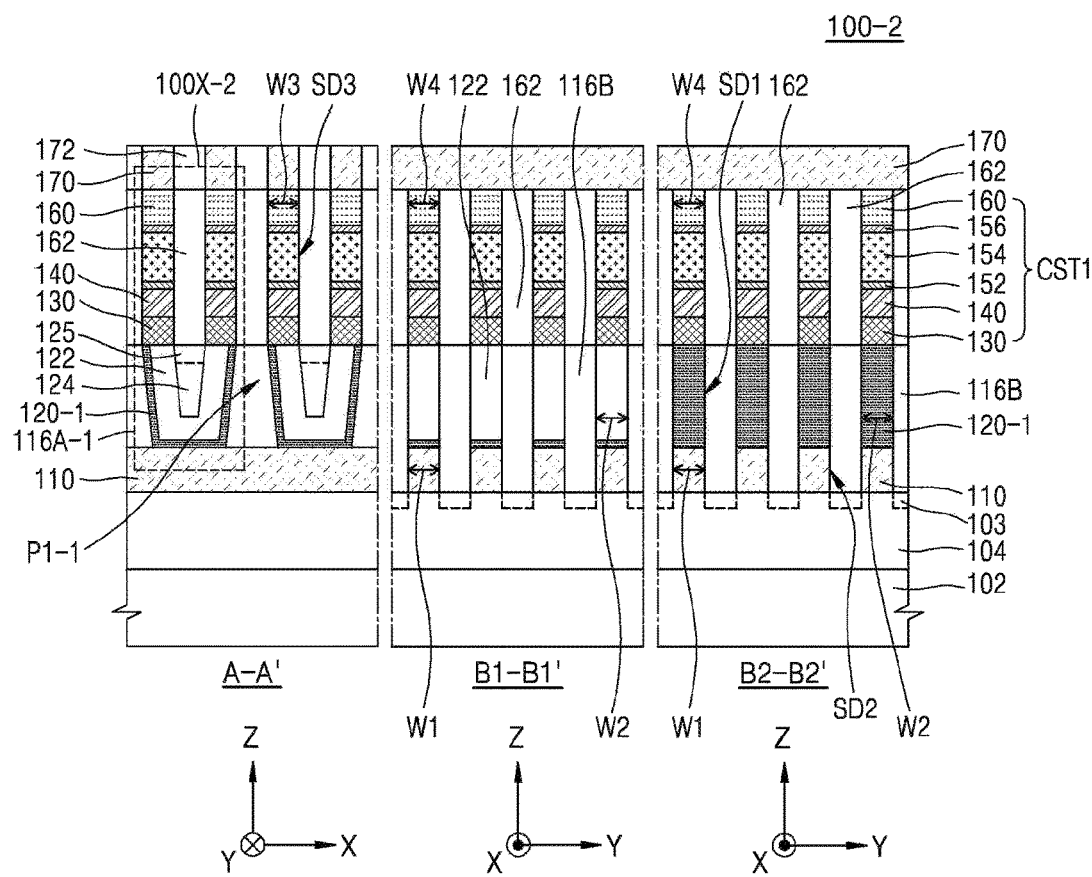
FIGS. 5A through 5C are drawings for explaining a variable resistance memory device according to another example embodiment of the inventive concepts.
Figure 5B:
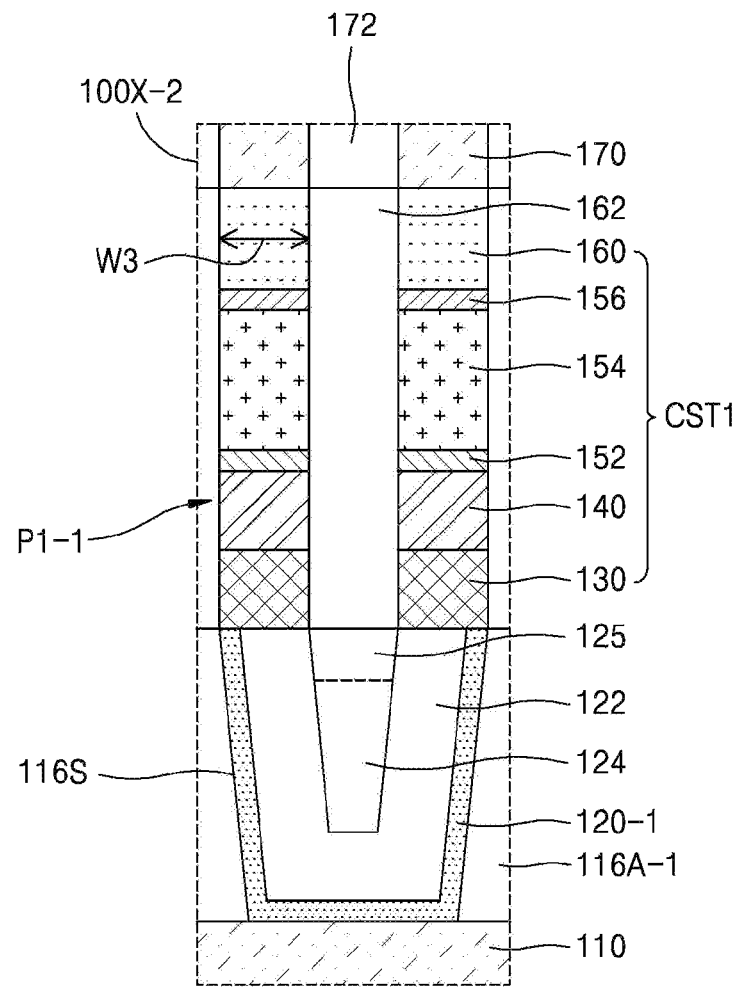
Figure 5C:
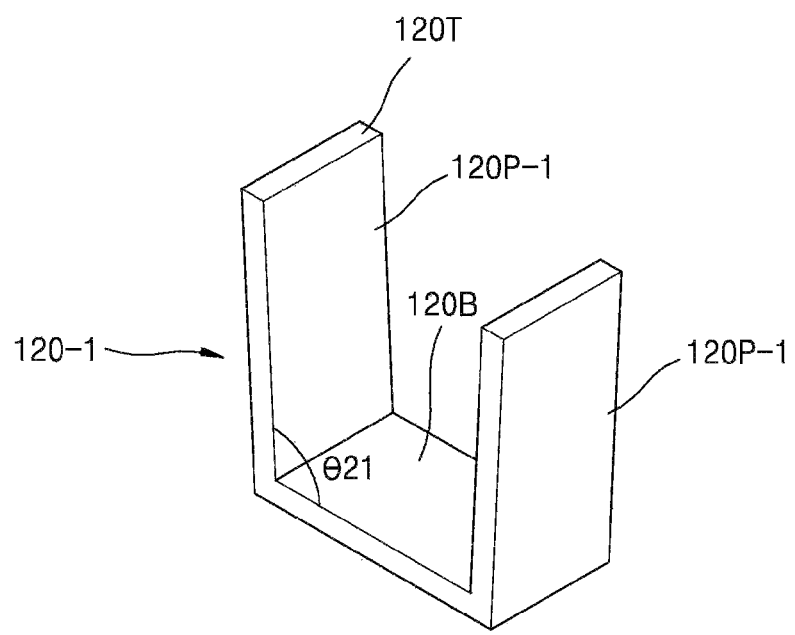

FIGS. 5A through 5C are drawings for explaining a variable resistance memory device 100-2 according to another example embodiment of the inventive concepts.

FIG. 5A shows cross-sectional views illustrating main components of portions corresponding to the A-A' cross-section, the B1-B1' cross-section, and the B2-B2' cross-section in FIG. 2. FIG. 5B is an enlarged cross-sectional view of a dashed line region 100X-2 of FIG. 5A. FIG. 5C is a schematic perspective view of a heating electrode layer 120-1. In FIGS. 5A and 5B, the same reference numerals as those in FIGS. 3A through 3E may denote the same members. The variable resistance memory device 100-2 may have substantially the same configuration as the variable resistance memory device 100 described with reference to FIGS. 3A through 3E.

However, a first insulating pattern 116A-1 of the variable resistive memory device 100-2 may have an inclined sidewall 116S at the bottom of a memory cell pillar P1-1. A width of the first insulating pattern 116A-1 in the first direction (X direction) may increase toward the substrate 102. Accordingly, in the memory cell pillar P1-1, a heating electrode layer 120-1 and the insulating spacer 122 may be contact the inclined sidewall 116S of the first insulating pattern 116A-1.

The heating electrode layer 120-1 may include the base portion 120B extending in parallel with the first conductive line 110, and two inclined fin portions 120P-1 extending from both ends of the base portion 120B, respectively, along the inclined sidewall 116S of the first insulating pattern 116A-1 such that a first distance between the two inclined pin portions 120P-1 at a first height is greater than a second distance between the two inclined pin portions 120P-1 at a second height, which is lower than the first height. An angle of incidence θ21 between the base portion 120B and the inclined fin portion 120P-1 may be an obtuse angle. In other words, the angle of incidence θ21 between the sidewall of the inclined fin portion 120P-1 and the surface of the base portion 120B may be an obtuse angle.

FIG. 6 is a drawing for explaining a variable resistance memory device 200 according to another example embodiment of the inventive concepts.

The variable resistance memory device 200 may include bottom word lines 210 extending in parallel with each other in the first direction (X direction), common bit lines 220 extending in parallel with each other in the second direction (Y direction), and top word lines 230 extending in parallel with each other in the first direction (X direction) on the substrate 102. In one example embodiment, the bottom word lines 210 and the common bit lines 220 may correspond to the first conductive lines 110 and the second conductive lines 170 illustrated in FIGS. 3A through 3E, respectively. In another example embodiment, the common bit lines 220 and the top word lines 230 may correspond to the first conductive lines 110 and the second conductive lines 170 illustrated in FIGS. 3A through 3E, respectively.

Each of the first memory cells MC1 may be arranged at intersections between the bottom word lines 210 and the common bit lines 220. Each of second memory cells MC2 may be arranged at intersections between the common bit lines 220 and the top word lines 230. The first memory cells MC1 and the second memory cells MC2 may include the memory cell pillar P1 described with reference to FIGS. 3A to 3E, respectively.

The variable resistance memory device 200 may have a congruent arrangement, in which the shapes of the first memory cells MC1 and the second memory cells MC2 are rotated by 90° with respect to each other. An angle of rotation of the second memory cell MC2 with respect to the first memory cell MC1 may not be limited to that illustrated in FIG. 6, and may be variously selected as desired.

FIG. 6 illustrates that the first memory cells MC1 and the second memory cells MC2 may include the memory cell pillar P1 described with reference to FIGS. 3A to 3E, respectively. However, example embodiments are not limited thereto. For example, the first memory cell MC1 and the second memory cell MC2 may include the memory cell pillar P1-1 as illustrated in FIGS. 5A through 5C. However, example embodiments of the inventive concepts are not limited thereto, and a memory cell pillar may be modified to have various shapes.

Figure 7A:
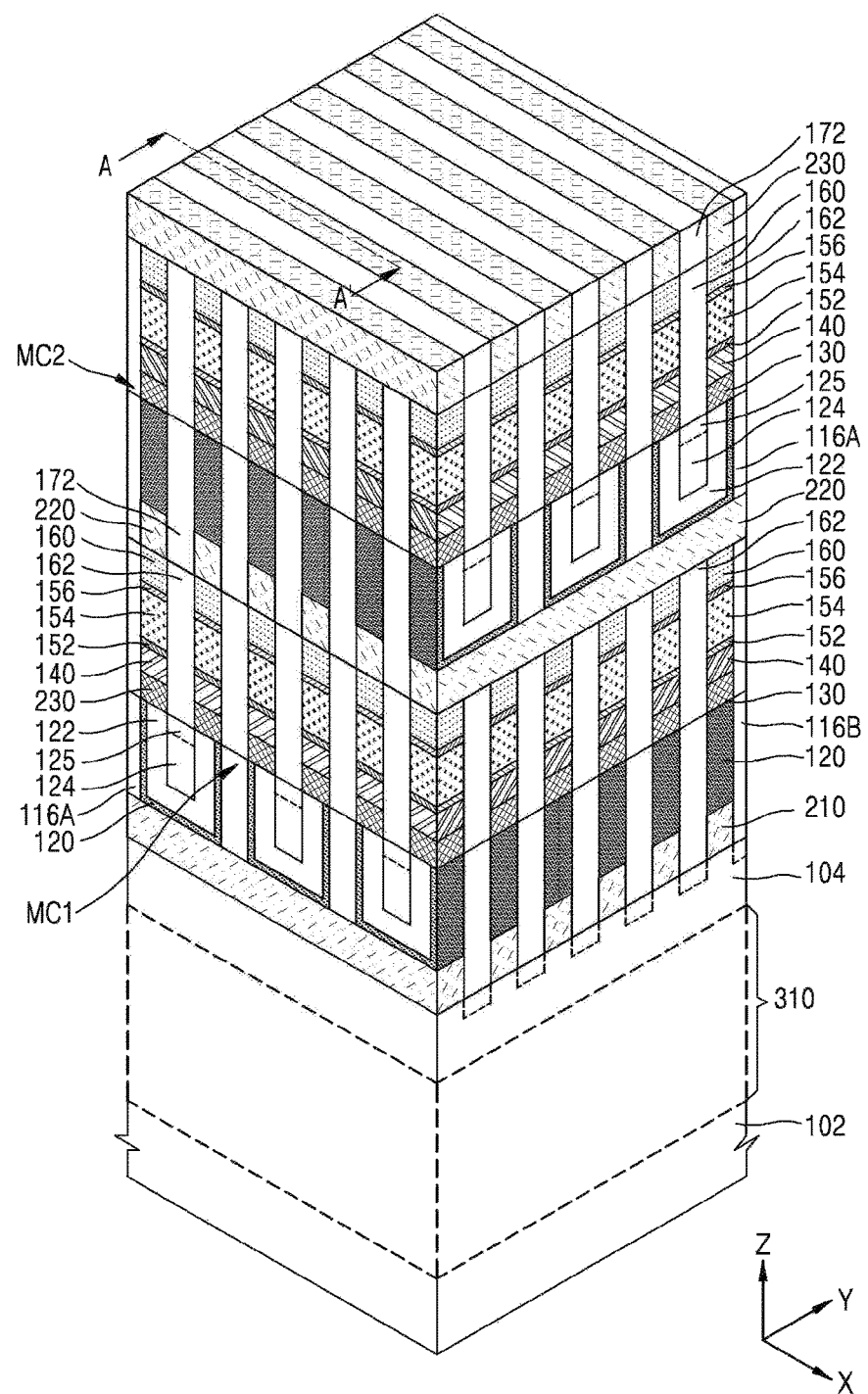
FIGS. 7A and 7B are drawings for explaining a variable resistance memory device according to another example embodiment of the inventive concepts.
Figure 7B:
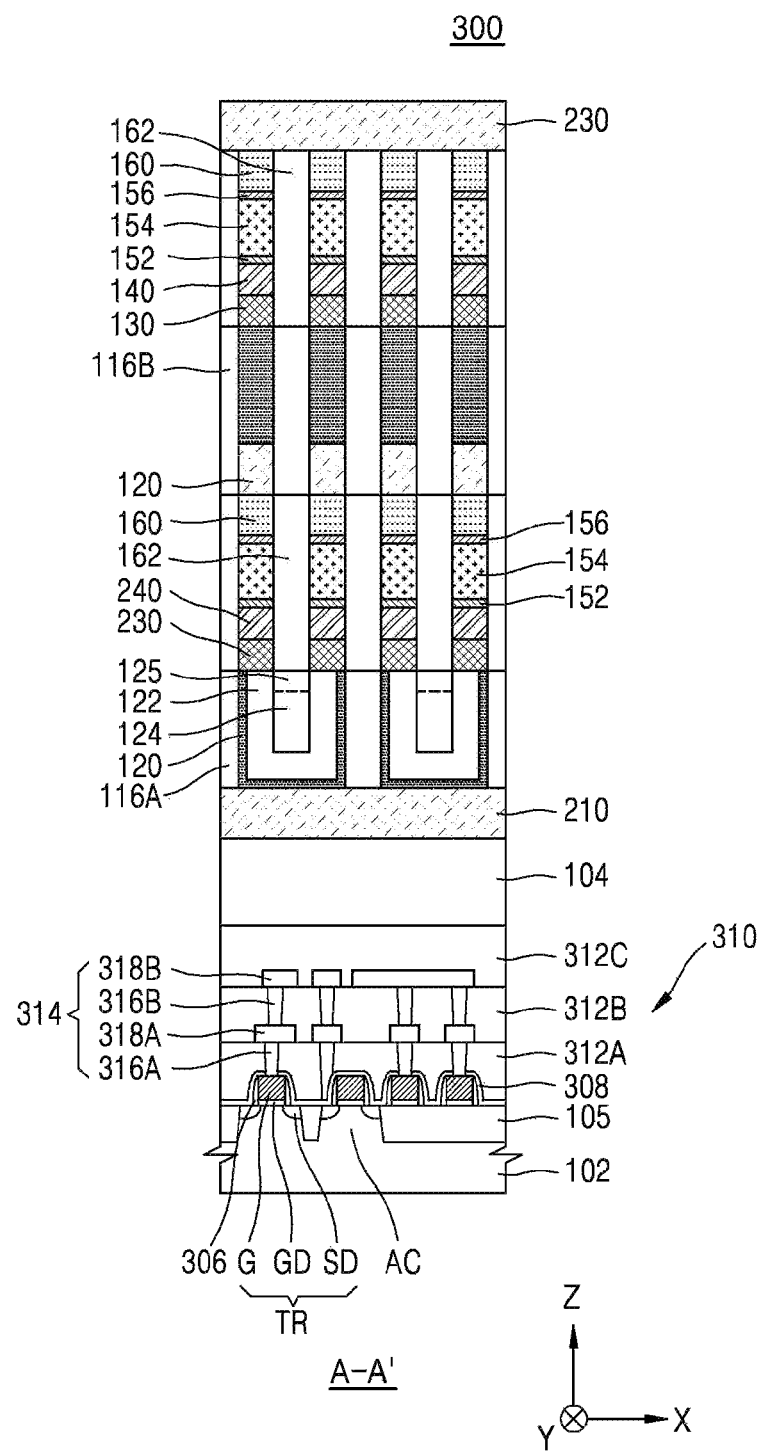

FIGS. 7A and 7B are drawings for explaining a variable resistance memory device 300 according to another example embodiment of the inventive concepts.

FIG. 7A is a perspective view illustrating a major configuration of the variable resistance memory device 300 according to an example embodiment of the inventive concepts. FIG. 7B is a cross-sectional view illustrating a major configuration of A-A' cross-section in FIG. 7A. In FIGS. 7A and 7B, the same reference numerals as those in FIGS. 3A through 3E, and 6 may denote the same elements, and a detailed description thereof will be omitted here.

The variable resistance memory device 300 may include a driving circuit region 310 formed on the substrate 102 and have a cell on peri (COP) structure in which memory cells are arranged above the driving circuit region 310. The variable resistance memory device 300 may include the driving circuit region 310 formed on a first level on the substrate 102, and a plurality of first memory cells MC1 and a plurality of second memory cells MC2 formed on a level higher than the first level on the substrate 102.

The driving circuit region 310 may be an area in which peripheral circuits or driving circuits for driving the first memory cells MC1 and the second memory cells MC2 are arranged. The peripheral circuits in a driving circuit region 310 may be circuits capable of processing input/output data at a high speed for driving the first memory cells MC1 and the second memory cells MC2. In some example embodiments, the peripheral circuits may include a page buffer, a latch circuit, a cache circuit, a column decoder, a sense amplifier, a data in/out circuit, a row decoder, or the like.

As illustrated in FIG. 7B, an active region AC may be defined by the device isolation layer 105 in the substrate 102. A plurality of transistors TR constituting the driving circuit region 310 may be formed on the active region AC of the substrate 102. The plurality of transistors TR each may include a gate G, a gate insulating layer GD, and a source/drain region SD. Both sidewalls of the gate G may be covered with an insulating spacer 306, and an etch-stop layer 308 may be formed on the gate G and the insulating spacer 306. The etch-stop layer 308 may include an insulating material such as silicon nitride and silicon oxynitride. A plurality of interlayer insulating layers 312A, 312B, and 312C may be sequentially stacked on the etch-stop layer 308. The plurality of interlayer insulating layers 312A, 312B, and 312C may include silicon oxide, silicon oxynitride, silicon oxynitride, or the like.

The driving circuit region 310 may include a multilayer wiring structure 314 electrically connected to the plurality of transistors TR. Wiring layers of the multilayer wiring structure 314 may be insulated from each other by the plurality of interlayer insulating layers 312A, 312B, and 312C, respectively. The multilayer wiring structure 314 may include a first contact 316A, a first wiring layer 318A, a second contact 316B, and a second wiring layer 318B which are sequentially stacked and electrically connected to each other on the substrate 102. The first wiring layer 318A and the second wiring layer 318B may include a metal, a conductive metal nitride, a metal silicide, or a combination thereof.

In FIGS. 7A and 7B, the multilayer wiring structure 314 is illustrated as having a two-layer wiring structure including the first wiring layer 318A and the second wiring layer 318B, but the inventive concepts are not limited thereto. For example, the multilayer wiring structure 314 may have a three or more multilayer wiring structure depending on a layout of the driving circuit region 310, a type and arrangement of the gates G, and the like.

Another interlayer insulating layer 104 may be formed on the plurality of interlayer insulating layers 312A, 312B, and 312C. Although not illustrated, a wiring structure (not shown), which is connected between the plurality of first memory cells MC1 and the plurality of second memory cells MC2 and the driving circuit region 310, may penetrate the interlayer insulating layer 104. The plurality of first memory cells MC1 and the plurality of second memory cells MC2 may be arranged on the driving circuit region 310 in the variable resistance memory device 300 so that the degree of integration of the variable resistance memory device 300 can be further increased.

Next, a method of manufacturing a variable resistance memory device according to example embodiments of the inventive concepts will be described in detail.

FIGS. 8 through 16 are cross-sectional views illustrating a method of manufacturing a variable resistance memory device according to a process sequence according to an example embodiment of the inventive concepts.

An example method of manufacturing the variable resistance memory device 100 illustrated in FIGS. 3A through 3E will be described with reference to FIGS. 8 through 16. FIGS. 8 through 16 illustrate main components of portions corresponding to A-A' cross-section, B1-B1' cross-section, and B2-B2' cross-section in FIG. 3A.

Referring to FIG. 8, the interlayer insulating layer 104 may formed on the substrate 102, and a first conductive layer 110L may be formed on the interlayer insulating layer 104. The first insulating pattern 116A may be formed on the first conductive layer 110L. The first insulating patterns 116A may be formed by providing an insulating material layer on the interlayer insulating layer 104 and patterning the insulating pattern layer by using a photolithography process.

The first insulating patterns 116A may extend in parallel with each other in the second direction (Y direction). Both sidewalls of the first insulating pattern 116A may extend substantially in the third direction (Z direction) (e.g., in a direction perpendicular to the top surface of the substrate 102). The first insulating pattern 116A may include a nitride layer or an oxide layer. For example, the first insulating pattern 116A may include a silicon nitride layer.

The first insulating patterns 116A may have a sixth width W6 in the first direction (X direction) and may be spaced apart from each other with a first gap G1 therebetween. The first gap G1 may be about twice the sixth width W6. The first gap G1 may provide an embedding space in which materials desired to form the memory cell pillar P1 (refer to FIGS. 3A through 3D) are embedded. The first conductive layer 110L may be exposed through the first gap G1 between adjacent first insulation patterns 116A.

Referring to FIG. 9, a heating electrode material layer 120L and an insulating spacer layer 122L may be provided to conformally cover exposed surfaces of the first insulating pattern 116A and the first conductive layer 110L. Then, a gap-fill insulating material layer 124L filling each space between the first insulating patterns 116A on the insulating spacer layer 122L may be formed.

Constituent materials of the heating electrode material layer 120L, the insulating spacer layer 122L, and the gap-fill insulating material layer 124L may be the same as those of the heating electrode layer 120, the insulating spacer 122, and the gap-fill insulating layer 124 described above, respectively. The insulating spacer layer 122L and the gap-fill insulating material layer 124L may include materials having different etch selectivities with respect to each other. For example, the insulating spacer layer 122L may include a silicon oxide layer and the gap-fill insulating material layer 124L may include a silicon nitride layer.

Referring to FIG. 10, undesirable portions of material layers on the top surface of the first insulating pattern 116A may be removed so that the top surface of the first insulating pattern 116A is exposed. In this manner, the heating electrode material layer 120L, the insulating spacer layer 122L, and the gap-fill insulating material layer 124L may remain between the first insulating patterns 116A. Height of each of the first insulating pattern 116A, the heating electrode material layer 120L, the insulating spacer layer 122L, and the gap-fill insulating material layer 124L may be reduced while the undesirable portions of material layers are removed. A chemical mechanical polishing (CMP) process or an etch back process may be performed in order to remove the undesirable portions of material layers.

Referring to FIG. 11, a first mask pattern M1 may be formed on the first insulating pattern 116A, the heating electrode material layer 120L, the insulating spacer layer 122L, and the gap-fill insulating material layer 124L. The gap-fill insulating material layer 124L, the insulating spacer layer 122L, the heating electrode material layer 120L, and the first conductive layer 110L may be simultaneously etched by using the first mask pattern M1 as an etching mask.

As illustrated in FIGS. 3A through 3D, the first mask pattern M1 may have line patterns each extending in the first direction (X direction) and being parallel with each other in the second direction (Y direction), like the first conductive line 110. The first mask pattern M1 may include polysilicon, but example embodiments are not limited thereto.

Accordingly, a line-shaped pattern structure including the first conductive line 110 extending in the first direction (X direction), the heating electrode layer 120, the insulating spacer 122, and the gap-fill insulating layer 124 may be formed. The interlayer insulating layer 104 may be exposed through line spaces LS 1 between the line-shaped pattern structures. The first conductive line 110 may be formed so as to extend in the first direction (e.g., in the X direction).

As described above, when the heating electrode material layer 120L and the first conductive layer 110L are simultaneously etched in the first direction (X direction), both the sidewalls SD2 of the heating electrode layer 120 may be aligned with both the sidewalls SD1 of the first conductive line 110 in the first direction (X direction). In addition, the substrate recess portion 103 may be a recess formed in the substrate 102 in the first direction (X direction) in a self-aligned manner with respect to both the sidewalls SD1 of the first conductive line 110 in the first direction (X direction).

Insulating performance between the first conductive lines 110 may be improved due to the substrate recess portion 103. In addition, because the heating electrode layer 120 and the first conductive lines 110 are aligned with each other in the second direction (Y direction), a bridge due to misalignment between the heating electrode layers 120 and the first conductive lines 110 may be mitigated or prevented, thereby improving reliability of the variable resistance memory device. Further, because the heating electrode layers 120 are aligned with each other in the second direction (Y direction), a bridge due to misalignment between the heating electrode layers 120 may be mitigated or prevented, thereby improving reliability of the variable resistance memory device. Still further, because the first conductive lines 110 are aligned with each other in the second direction (Y direction), a bridge due to misalignment between the first conductive lines 110 may be mitigated or prevented, thereby improving reliability of the variable resistance memory device.

Referring to FIG. 12, after the first mask pattern M1 is removed, a second insulating pattern 116B filling the line spaces LS 1 between the line-shaped pattern structures may be formed. Both sidewalls of the second insulation pattern 116B may extend substantially in the third direction (Z direction).

After an insulating layer having a thickness sufficient to fill a plurality of line spaces LS 1 is formed on a resultant structure in FIG. 11, to form the second insulating pattern 116B, an undesirable portion of the insulating layer may be removed by the CMP process or the etch back process so that top surfaces of the first insulating pattern 116A, the heating electrode layer 120, the insulating spacer 122, and the gap-fill insulating layer 124 are exposed.

The second insulating pattern 116B may be a planarized insulating pattern layer because the second insulating pattern 116B is made by filling the line spaces LS 1 with an insulating layer, and then planarizing the insulating layer. Heights of the plurality of first insulating patterns 116A, the heating electrode layer 120, the insulating spacer 122, and the gap-fill insulating layer 124 may be reduced by removing undesirable portion of the insulating layer is removed.

The second insulating patterns 116B may have a seventh width W7 in the second direction (Y direction), and may be spaced apart from each other with a second gap G2 therebetween. The second gap G2 may correspond to the width of the heating electrode layer 120 or the first conductive line 110 in the second direction (Y direction) (e.g., W1 or W2 in FIGS. 3A and 3B).

Referring to FIG. 13, a cell stack material layer CSTL1 covering the first insulating pattern 116A, the second insulating pattern 116B, the insulating spacer 122, and the gap-fill insulating layer 124 may be formed on the heating electrode layer 120. The cell stack material layer CSTL1 may include a variable resistance material layer 130L, a bottom electrode material layer 140L, a first interface material layer 152L, a selection device material layer 154L, a second interface material layer 156L, and a top electrode material layer 160L.

The cell stack material layer CSTL1 may be obtained by sequentially forming the bottom electrode material layer 140L, the first interface material layer 152L, the selection device material layer 154L, the second interface material layer 156L, and the top electrode material layer 160L on the variable resistance material layer 130L.

Referring to FIG. 14, the cell stack structure CST1 may be formed by patterning the cell stack material layer CSTL1 in the first direction (X direction) and the second direction (Y direction) by using the photolithography process. The cell stack structure CST1 may include the top electrode layer 160, the second interface layer 156, the selection device layer 154, the first interface layer 152, the bottom electrode layer 140, and the variable resistance layer 130. The cell stack structure CST1 may include the heating electrode layer 120 to constitute the memory cell pillar P1 as illustrated in FIGS. 3A and 3B. The cell stack structures CST1 each may be arranged at positions corresponding to the memory cell MCs in FIG. 2, respectively, and may be arranged in a matrix when viewed in a plan view.

When the cell stack structure CST1 is formed by simultaneously etching the cell stack material layer CSTL1 including the variable resistance material layer 130L and the selection device material layer 154L in the first direction (X direction) and the second direction (Y direction), etching damage of the variable resistance layer 130 and the selection device layer 154 (e.g., the etching damage of the selection device layer 154 may be reduced), thereby improving reliability of the variable resistance memory device.

In an example embodiment, the cell stack structure CST1 may be formed by patterning the cell stack material layer CSTL1 in the first direction (X direction) and then, the cell stack material layer CSTL1 in the second direction (Y direction) by using the photolithography process. In another example embodiment, the cell stack structure CST1 may be formed by simultaneously patterning the cell stack material layer CSTL1 in the first direction (X direction) and the second direction (Y direction) by using the photolithography process.

Accordingly, the cell stack structure CST1 including the variable resistance layer 130 and the selection device layer 154 may have the third width W3 in the first direction (X direction). In addition, the cell stack structure CST1 including the variable resistance layer 130 and the selection device layer 154 may have the fourth width W4 in the second direction (Y direction). The third width W3 in the first direction (X direction) and the fourth width W4 in the second direction (Y direction) of the cell stack structure CST1 may be equal to or different from each other.

In addition, when the cell stack material layer CSTL1 including the variable resistance material layer 130L and the selection device material layer 154L are simultaneously etched in the second direction (Y direction), the gap-fill insulating layer 124 may be etched to provide the gap-fill recess portion 125 such that a top surface of the gap-filling insulating layer 124 is lower than a top surface of the sidewall of the insulating spacer 122. The gap-fill recess portion 125 being a recess formed by etching the gap-fill insulating layer 124 in a self-aligned manner with respect to two neighboring sidewalls SD3 of the cell stack structures CST1 in the second direction (Y direction). Insulating performance between the cell stack structures CST1 may be improved due to the gap-fill recess portion 125.

Referring to FIG. 15, the third insulating pattern 162 filling spaces between the cell stack structures CST1 may be formed. The third insulating pattern 162 may be a planarized insulation pattern layer because the third insulating pattern 162 is obtained by forming an insulating layer planarizing the third insulating pattern 16 to form the third insulating pattern 162 between cell stack structures CST1. The third insulating pattern 162 may extend in the first direction (X direction) and the second direction (Y direction).

Referring to FIG. 16, the second conductive lines 170 extending across the cell stack structure CST1 in the second direction (Y direction) may be formed. The second conductive lines 170 may be formed after forming the heating electrode material layer 120L on the cell stack structures CST1 and after forming the third insulating pattern 162, and then, by providing a second conductive layer and patterning the second conductive layer to form the second conductive lines 170 in the second direction (Y direction) by using the photolithography process.

Next, the fourth insulating pattern 172 may be formed by forming an insulating layer filling spaces between the second conductive lines 170, and planarizing the insulating layer. The fourth insulating pattern 172 may be a planarized insulation pattern layer obtained by forming an insulating layer between the second conductive lines 170, and by performing planarization.

A method of manufacturing the variable resistance memory device 100 illustrated in FIGS. 3A through 3E has been described with reference to FIGS. 8 through 16. However, a variable resistance memory device may be manufactured by using processes described with reference to FIGS. 8 through 16 or various methods modified and/or changed from the processes within the inventive concepts.

FIGS. 17 through 20 are cross-sectional views illustrating a method of manufacturing a variable resistance memory device according to a process sequence according to another example embodiment of the inventive concepts.

A method of manufacturing the variable resistance memory device 100-1 illustrated in FIGS. 4A and 4B will be described with reference to FIGS. 17 through 19. FIGS. 17 through 19 illustrate main components of portions corresponding to the A-A' cross-section, the B1-B1' cross-section, and the B2-B2' cross-section in FIG. 3A according to a process sequence. In FIGS. 17 through 19, the same contents as those in FIGS. 8 through 16 will be briefly described or omitted.

As illustrated in FIG. 13, the cell stack material layer CSTL1 covering the first insulating pattern 116A, the second insulating pattern 116B, the insulating spacer 122, and the gap-fill insulating layer 124 may be formed on the heating electrode layer 120. The cell stack material layer CSTL1 may include, as described above, the variable resistance material layer 130L, the bottom electrode material layer 140L, the first interface material layer 152L, the selection device material layer 154L, the second interface material layer 156L, and the top electrode material layer 160L.

Referring to FIG. 17, a first cell stack structure CST1a extending in the first direction (X direction) may be formed by patterning the cell stack material layer CSTL1 in the first direction (X direction) by using the photolithography process. At this time, the cell stack material layer CSTL1 may not be patterned in the second direction (Y direction).

The first cell stack structure CST1a extending in the first direction (X direction) may include the top electrode layer 160, the second interface layer 156, the selection device layer 154, the first interface layer 152, the bottom electrode layer 140, and the variable resistance layer 130 which extend in the first direction (X direction). The first cell stack structure CST1a which includes the variable resistance layer 130 and the selection device layer 154 and extends in the first direction (X direction) may have the fourth width W4 in the second direction (Y direction).

Referring to FIG. 18, the third insulation pattern 162 filling spaces between the first cell stack structures CST1a extending in the first direction (X direction) may be formed. The third insulating pattern 162 may be a planarized insulation pattern layer because the third insulating pattern 162 is obtained by forming an insulating layer between the first cell stack structures CST1a in the first direction (X direction), and planarizing the insulating layer. The third insulating pattern 162 may extend in the first direction (X direction). Next, the second conductive layer 170L may be formed on the cell stack material layer CSTL1 in the second direction (Y direction), the first cell stack structure CST1a in the first direction (X direction), and the third insulating pattern 162.

Referring to FIG. 19, the second conductive line 170 extending in the second direction (Y direction) by patterning the second conductive layer 170L and the cell stack material layer CSTL1 in the second direction (Y direction), and a second cell stack structure CST1b extending in the second direction (Y direction) may be simultaneously formed. When the second conductive layer 170L and the cell stack material layer CSTL1 are simultaneously etched in the second direction (Y direction), the gap-fill recess portion 125 recessed from both the sidewalls SD3 of the second cell stack structure CST1b in the second direction (Y direction) may be formed. In addition, the second cell stack structure CST1b which includes the variable resistance layer 130 and the selection device layer 154 and extends in the second direction (Y direction) may have the third width W3 in the first direction (X direction).

Referring to FIG. 20, a fifth insulating pattern 175 filling spaces between the second conductive lines 170 extending in the second direction (Y direction) and between the second cell stack structures CST1b extending in the second direction (Y direction) may be formed. The fifth insulating pattern 175 may be a planarized insulating layer because the fifth insulating pattern 175 is obtained by forming an insulating layer between the second conductive lines 170 extending in the second direction (Y direction) and between the second cell stack structures CST1b in the second direction (Y direction), and planarizing the insulating layer.

FIG. 21 is a configuration diagram of a variable resistance memory device 400 according to an example embodiment of the inventive concepts.

The variable resistance memory device 400 according to an example embodiment of the inventive concepts may include a memory cell array 410, a decoder 420, a read/write circuit 430, an input/output buffer 440, and a controller 450. The memory cell array 410 may include the memory cells described above.

A plurality of memory cells in the memory cell array 410 may be connected to the decoder 420 via the word line WL, and to the read/write circuit 430 via the bit line BL. The decoder 420 may receive an external address ADD, and decode a row address and a column address to be accessed in the memory cell array 410 under the control of the controller 450 which operates according to a control signal CTRL.

The read/write circuit 430 may receive data DATA from the input/output buffer 440 and a data line DL, write data DATA to a memory cell selected from the memory cell array 410 under the control of the controller 450, or provide data DATA read from a memory cell selected from the memory cell array 410 to the input/output buffer 440 under the control of the controller 450.

FIG. 22 is a configuration diagram of a data processing system 500 including the variable resistance memory device 400 according to an example embodiment of the inventive concepts.

The data processing system 500 may include a memory controller 520 coupled between a host and the variable resistance memory device 400. The memory controller 520 may be configured to access the variable resistive memory device 400 in response to a request from the host. The memory controller 520 may include a processor 5201, an operation memory 5203, a host interface 5205, and a memory interface 5207.

The processor 5201 may control an overall operation of the memory controller 520, and the operation memory 5203 may store applications, data, control signals, and the like needed for an operation of the memory controller 520. The host interface 5205 may perform protocol conversion for exchanging data/control signals between the host and the memory controller 520. The memory interface 5207 may perform protocol conversion for exchanging data/control signal between the memory controller 520 and the variable resistance memory device 400. The variable resistance memory device 400 is the same as described above with reference to FIG. 21, and thus, a description thereof will be omitted. The data processing system 500 according to an example embodiment of the inventive concepts may be a memory card, but example embodiments are not limited thereto.

FIG. 23 is a configuration diagram of a data processing system 600 including the variable resistance memory device 400 according to an example embodiment of the inventive concepts.

The data processing system 600 may include the variable resistance memory device 400, a processor 620, an operation memory 630, and a user interface 640, and may further include a communication module 650 as needed. The processor 620 may be a central processing unit.

The operation memory 630 may store application programs, data, control signals, and the like needed for an operation of the data processing system 600. The user interface 640 may provide an environment in which a user can access the data processing system 600, and may provide to the user data processing, results, and the like of the data processing system 600.

The variable resistance memory device 400 is the same as described above with reference to FIG. 21, and thus a description thereof will be omitted. The data processing system 600 may be used as a disk device, an internal/external memory card of a portable electronic device, an image processor, or other application chipset.

While the inventive concepts have been particularly shown and described with reference to some example embodiments thereof, it will be understood that various changes in form and details may be made therein without departing from the spirit and scope of the following claims.

What is claimed is:

1. A variable resistance memory device comprising:
   a first conductive line on a substrate, the first conductive line extending in a first direction;
   a second conductive line on the first conductive line, the second conductive line extending in a second direction, the second direction being a direction crossing the first direction; and
   a memory cell pillar connected to the first conductive line and the second conductive line at an intersection point therebetween, the memory cell pillar including a heating electrode layer and a variable resistance layer, the variable resistance layer in contact with the heating electrode layer, two opposite sidewalls of the heating electrode layer aligned with two opposite sidewalls of the first conductive line in the first direction, respectively.

2. The variable resistance memory device of claim 1, wherein the heating electrode layer is in contact with a portion of a bottom surface of the variable resistance layer in the first direction, and is in contact with an entirety of the bottom surface of the variable resistance layer in the second direction.

3. The variable resistance memory device of claim 1, wherein the substrate includes a substrate recess portion, the substrate recess portion being a recess formed in the substrate in a self-aligned manner with respect to the two opposite sidewalls of the first conductive line in the first direction.

4. The variable resistance memory device of claim 1, wherein a width of the heating electrode layer in the second direction is equal to a width of the first conductive line in the second direction.

5. The variable resistance memory device of claim 1, wherein the heating electrode layer comprises a base portion extending parallel to the first conductive line in the first direction, and a fin portion extending from one end of the base portion in a third direction, which is a direction perpendicular to both the first direction and the second direction, such that the fin portion is in contact with a portion of a bottom surface of the variable resistance layer.

6. The variable resistance memory device of claim 1, wherein the heating electrode layer comprises a base portion extending parallel to the first conductive line in the first direction, and a fin portion upwardly extending from one end of the base portion in an inclined manner such that the fin portion form an inclined sidewall of the heating electrode layer and is in contact with a portion of a bottom surface of the variable resistance layer.

7. The variable resistance memory device of claim 1, wherein the heating electrode layer comprises a base portion extending parallel to the first conductive line and a fin portion upwardly extending from one end of the base portion, the memory cell pillar further comprises an insulating spacer in contact with the base portion and the fin portion, and the insulating spacer has a bottom surface in contact with the base portion and a top surface in contact with the variable resistance layer.

8. The variable resistance memory device of claim 1, wherein the memory cell pillar further comprises a cell stack structure, the cell stack structure includes the variable resistance layer and a selection device layer on the heating electrode layer, and the cell stack structure has a first width in the first direction and a second width in the second direction.

9. The variable resistance memory device of claim 1, wherein the memory cell pillar further comprises a cell stack structure, the cell stack structure includes the variable resistance layer and a selection device layer on the heating electrode layer, and both sidewalls of the second conductive line are aligned with both sidewalls of the cell stack structure in the second direction.

10. The variable resistance memory device of claim 9, further comprising:
an insulating spacer in contact with the sidewall of the heating electrode layer and a bottom surface of the variable resistance layer, the insulating spacer having a U-shaped cross-section in the first direction, and a gap-fill insulating layer filling a space defined by the insulating spacer to a level lower than a top surface of the sidewall of the insulating spacer such that a gap-fill recess, which is aligned with respect to a sidewall of the cell stack structure in the second direction, is provided in a portion of the space that is devoid of the gap-filling insulating layer.

11. A variable resistance memory device comprising:
a plurality of first conductive lines extending in a first direction, the plurality of first conductive lines spaced apart from each other in a second direction perpendicular to the first direction;
a plurality of second conductive lines extending in the second direction above the first conductive lines, the plurality of second conductive lines spaced apart from each other in the first direction; and
a plurality of memory cell pillars at intersections between the first conductive lines and the second conductive lines, the memory cell pillars spaced apart from each other, the memory cell pillars connected to the first conductive lines and the second conductive lines, the memory cell pillars including a heating electrode layer and a variable resistance layer in contact with the heating electrode layer, two opposite sidewalls of the heating electrode aligned with two opposite sidewalls of the first conductive line in the first direction, and a width of the heating electrode layer being equal to that of the first conductive line in the second direction.

12. The variable resistance memory device of claim 11, wherein the memory cell pillars have a shape of one of a cylinder, an elliptic column, and a polygonal column, and the first conductive lines and the second conductive lines serves as word lines or bit lines.

13. The variable resistance memory device of claim 11, wherein a substrate provided with the first conductive lines, the second conductive lines, and the memory cell pillars thereon includes a substrate recess portion, the substrate recess portion being a recess formed in the substrate in a self-aligned manner with respect to the two opposite sidewalls of the first conductive lines in the first direction.

14. The variable resistance memory device of claim 11, wherein the memory cell pillars further comprise a cell stack structure, the cell stack structure includes the variable resistance layer and a selection device layer on the heating electrode layer, both sidewalls of the second conductive line are aligned with both sidewalls of the cell stack structure in the second direction, and a width of the second conductive lines is equal to that of the cell stack structure in the first direction.

15. The variable resistance memory device of claim 14, further comprising:
an insulating spacer in contact with a bottom surface of the cell stack structure; and
a gap-fill insulating layer filling a space defined by the insulating spacer in the first direction, and the gap-fill insulating layer filling the space to a level lower than a top surface of a sidewall of the insulating spacer such that a gap-fill recess, which is aligned with respect to a sidewall of the cell stack structure in the second direction, is provided in a portion of the space that is devoid of the gap-filling insulating layer.

16. The variable resistance memory device of claim 11, wherein the heating electrode layer is in contact with a portion of a bottom surface of the variable resistance layer in the first direction and is in contact with an entirety of the bottom surface of the variable resistance layer in the second direction.

17. A variable resistance memory device comprising:
- a plurality of first conductive lines extending in a first direction, the plurality of first conductive lines spaced apart from each other in a second direction perpendicular to the first direction;
- a plurality of second conductive lines extending in the second direction above the first conductive lines, the plurality of second conductive lines spaced apart from each other in the first direction; and
- a plurality of memory cell pillars at intersections between the first conductive lines and the second conductive lines, the memory cell pillars spaced apart from each other, the memory cell pillars connected to the first conductive lines and the second conductive lines, the memory cell pillars including a heating electrode layer and a variable resistance layer in contact with the heating electrode layer, two opposite sidewalls of the heating electrode layer aligned with two opposite sidewalls of the first conductive line, and the heating electrode layer being in contact with a portion of a bottom surface of the variable resistance layer in the first direction and being in contact with an entirety of the bottom surface of the variable resistance layer in the second direction.

18. The variable resistance memory device of claim 17, wherein
- the memory cell pillars further comprise a cell stack structure,
- the cell slack structure includes the variable resistance layer and a selection device layer on the heating electrode layer, and
- both sidewalls of the second conductive line are aligned with both sidewalls of the cell stack structure in the second direction.

19. The variable resistance memory device of claim 18, wherein
- a width of the heating electrode layer is equal to that of the first conductive line in the second direction, and
- a width of the second conductive lines is equal to that of the cell stack structure in the first direction.

20. The variable resistance memory device of claim 18, further comprising:
- an insulating spacer in contact with a bottom surface of the cell stack structure; and
- a gap-fill insulating layer filling a space defined by the insulating spacer in the first direction, and the gap-fill insulating layer filling the space to a level lower than a top surface of a sidewall of the insulating spacer.

* * * * *